(12) United States Patent
Hong et al.

(10) Patent No.: US 12,400,594 B2
(45) Date of Patent: Aug. 26, 2025

(54) DISPLAY DEVICE, ELECTRONIC DEVICE, AND IMAGE DATA COMPENSATING METHOD OF DISPLAY DEVICE

(71) Applicant: Samsung Display Co., LTD., Yongin-si (KR)

(72) Inventors: Seok Ha Hong, Yongin-si (KR); Joon Chul Goh, Yongin-si (KR); Dong Joon Kwag, Yongin-si (KR); Hyung Jin Kim, Yongin-si (KR); Jae Sung Bae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/492,681

(22) Filed: Oct. 23, 2023

(65) Prior Publication Data

US 2024/0135880 A1 Apr. 25, 2024
US 2024/0233642 A9 Jul. 11, 2024

(30) Foreign Application Priority Data

Oct. 24, 2022 (KR) ........................ 10-2022-0137776

(51) Int. Cl.
*G09G 3/3233* (2016.01)
*G09G 3/20* (2006.01)
*H01L 25/16* (2023.01)

(52) U.S. Cl.
CPC ......... *G09G 3/3233* (2013.01); *G09G 3/2007* (2013.01); *H01L 25/167* (2013.01);
(Continued)

(58) Field of Classification Search
CPC ....................... G09G 3/3233; G09G 2320/045
See application file for complete search history.

(56) References Cited

U.S. PATENT DOCUMENTS

| 7,213,940 B1 * | 5/2007 | Van De Ven | .......... H05B 45/20 257/89 |
| 7,675,492 B2 | 3/2010 | Park et al. | |

(Continued)

FOREIGN PATENT DOCUMENTS

| CN | 110097842 A | * | 8/2019 | ............ G09G 3/006 |
| KR | 10-1348753 B1 | | 1/2014 | |
| KR | 10-2023-0049186 A | | 4/2023 | |

*Primary Examiner* — William Boddie
*Assistant Examiner* — Bipin Gyawali
(74) *Attorney, Agent, or Firm* — Womble Bond Dickinson (US) LLP

(57) ABSTRACT

The display device includes a display panel and a pixel. A compensator configured to calculate a degradation rate of the pixel based on an input gray level of first image data, and compensates the first image data based on the degradation rate to generate second image data. A data driver configured to generate a data signal based on the second image data and configured to supply the data signal to the pixel. The pixel includes a first element group and a second element group connected in series to each other, the first element group includes at least one first light emitting element, and the second element group includes at least one second light emitting element. The compensator is to calculate the degradation rate by applying first information on the number of the first light emitting elements and second information on the number of the second light emitting elements.

20 Claims, 16 Drawing Sheets

(52) U.S. Cl.
CPC ............... *G09G 2300/0819* (2013.01); *G09G 2300/0842* (2013.01); *G09G 2320/0233* (2013.01); *G09G 2320/0257* (2013.01); *G09G 2320/0285* (2013.01); *G09G 2320/045* (2013.01); *G09G 2360/06* (2013.01)

(56) References Cited

U.S. PATENT DOCUMENTS

| | | | |
|---|---|---|---|
| 2017/0039933 A1* | 2/2017 | Shin | G09G 3/3225 |
| 2017/0200412 A1* | 7/2017 | Gu | G09G 3/3266 |
| 2019/0081261 A1* | 3/2019 | Lee | C09K 11/08 |
| 2021/0335216 A1* | 10/2021 | Nie | G09G 3/3233 |
| 2022/0122540 A1* | 4/2022 | Choi | G09G 3/3258 |
| 2022/0148492 A1* | 5/2022 | Yoon | G09G 3/3233 |
| 2023/0104466 A1 | 4/2023 | Hong et al. | |
| 2023/0267885 A1* | 8/2023 | Cho | H10H 20/84 345/214 |
| 2023/0274686 A1* | 8/2023 | Pyun | G09G 3/2007 |

\* cited by examiner

DISPLAY DEVICE, ELECTRONIC DEVICE, AND IMAGE DATA COMPENSATING METHOD OF DISPLAY DEVICE

CROSS-REFERENCE TO RELATED APPLICATION

This application claims priority to and the benefit of Korean Patent Application No. 10-2022-0137776 filed in the Korean Intellectual Property Office on Oct. 24, 2022, the entire content of which is incorporated by reference herein.

BACKGROUND

1. Field

The present disclosure relates to a display device, an electronic device, and an image data compensating method of the display device.

2. Description of the Related Art

Recently, interest in an information display is increasing. Accordingly, research and development on a display device are continuously being conducted.

SUMMARY

In the display device, a luminance deviation and an after-image may occur between pixels according to degradation of a pixel or a light emitting element. Because the light emitting element uses a self-luminous material, degradation of the material itself occurs and the luminance decreases over time.

In the display device, an age (for example, a stress or degradation degree) thereof is calculated or predicted for each pixel, the degradation and after-image are compensated based on the age. For example, the age may be calculated by accumulating stress based on a current flowing in and a light emitting time of each pixel per frame, and the like.

One or more embodiments of the present disclosure have been made in an effort to provide an after-image compensator capable of more accurately compensating for degradation of display quality due to degradation of a pixel or a light emitting element, a display device including the same, and an image data compensating method of the display device.

One or more embodiments of the present disclosure provides a display device including: a display panel including a pixel; a compensator configured to calculate a degradation rate of the pixel based on an input gray level of first image data, and configured to compensate the first image data based on the degradation rate to generate second image data; and a data driver configured to generate a data signal based on the second image data and configured to supply the data signal to the pixel. The pixel includes a first element group and a second element group connected in series to each other, the first element group includes at least one first light emitting element, and the second element group includes at least one second light emitting element. The compensator is to calculate the degradation rate by applying first information on the number of the first light emitting elements and second information on the number of the second light emitting elements.

The display device may further include a memory configured to store the first information and the second information.

Under a condition that a driving current flowing through the pixel is the same, the pixel may be differently degraded depending on the number of the first light emitting elements and the number of the second light emitting elements.

The compensator may be configured to: predict a value of the driving current flowing through the pixel based on the input gray level, calculate a first current density of the first element group based on the driving current and the first information about the number of the first light emitting elements, and calculate a first degradation rate of the first element group based on the first current density of the first element group.

The first current density of the first light emitting element may be proportional to the driving current, and may be inversely proportional to the number of the first light emitting elements.

The compensator may be configured to calculate a second current density of the second element group based on the driving current and the second information about the number of the second light emitting elements, calculate a second degradation rate of the second element group based on the second current density of the second element group, and calculate the degradation rate of the pixel based on the first degradation rate and the second degradation rate.

The compensator may be configured to calculate an output gray level of the second image data based on the input gray level and the degradation rate, and a value to which the degradation rate is applied to the output gray level may be the same as the input gray level.

The compensator may be configured to calculate the output gray level based on light emitting efficiency of the pixel corresponding to the input gray level, a current density of the pixel may vary according to the input gray level, and the light emitting efficiency may vary according to the current density.

Light emitting efficiency of a reference pixel corresponding to the input gray level may be preset in a lookup table, and the compensator may calculate the output gray level based on the lookup table.

The light emitting efficiency of the pixel may be calculated based on first light emitting efficiency of the first element group according to the number of the first light emitting elements and second light emitting efficiency of the second element group according to the number of the second light emitting elements.

Another embodiment of the present disclosure provides an image data compensating method of a display device, the method including: calculating a degradation rate of a pixel of a display panel based on an input gray level; and compensating the input gray level based on the degradation rate to generate an output gray level. The pixel includes a first element group and a second element group connected in series to each other, the first element group includes at least one first light emitting element, and the second element group includes at least one second light emitting element. The calculating of the degradation rate includes calculating the degradation rate by applying first information on the number of the first light emitting elements and second information on the number of the second light emitting elements.

The calculating of the degradation rate may further include obtaining the first information and the second information from a memory.

Under a condition that a driving current flowing through the pixel is the same, the pixel may be differently degraded depending on the number of the first light emitting elements and the number of the second light emitting elements.

The calculating of the degradation rate may further include predicting a value of the driving current flowing through the pixel based on the input gray level; calculating a first current density of the first element group based on the driving current and the first information about the number of the first light emitting elements; and calculating a first degradation rate of the first element group based on the first current density of the first element group.

The first current density of the first light emitting element may be proportional to the driving current, and may be inversely proportional to the number of the first light emitting elements.

The calculating of the degradation rate may further include calculating a second current density of the second element group based on the driving current and the second information about the number of the second light emitting elements; calculating a second degradation rate of the second element group based on the second current density of the second element group; and calculating the degradation rate of the pixel based on the first degradation rate and the second degradation rate.

The output gray level may be calculated based on the input gray level and the degradation rate, and a value to which the degradation rate is applied to the output gray level may be the same as the input gray level.

The generating of the output gray level may include calculating the output gray level based on light emitting efficiency of the pixel corresponding to the input gray level, a current density of the pixel may vary according to the input gray level, and the light emitting efficiency may vary according to the current density.

Light emitting efficiency of a reference pixel corresponding to the input gray level may be preset in a lookup table, and the output gray level may be calculated based on the lookup table.

The light emitting efficiency of the pixel may be calculated based on first light emitting efficiency of the first element group according to the number of the first light emitting elements and second light emitting efficiency of the second element group according to the number of the second light emitting elements.

According to the display device, the electronic device, and the image data compensating method of the display device according to the embodiments of the present invention, it is possible to calculate a current density for each element group in a pixel, to calculate a degradation rate of the pixel based on the current density, and to compensate for an input gray level of image data based on the degradation rate of the pixel. In addition, according to the display device, the electronic device, and the image data compensating method of the display device of the present invention, it is possible to compensate for an input gray level by additionally applying light emitting efficiency of a pixel in addition to a degradation rate of the pixel. Accordingly, more accurate after-image compensation may be performed, and degradation of display quality may be prevented.

Effects of one or more embodiments of the present disclosure are not limited by what is illustrated in the above, and more various effects are included in the present disclosure.

DETAILED DESCRIPTION

Figure 1:
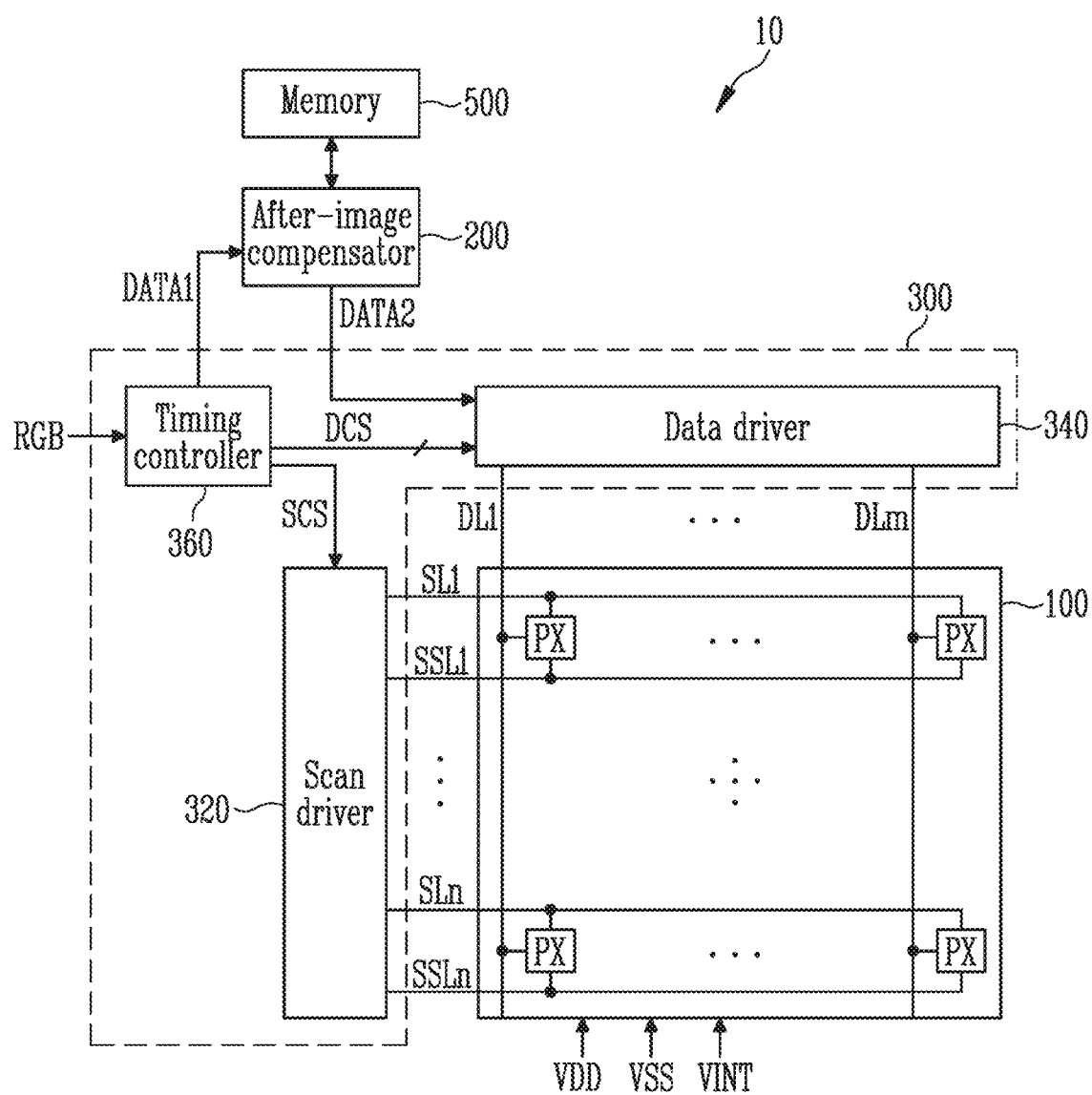
FIG. 1 illustrates a block diagram of a display device according to one or more embodiments.

Because the present disclosure may be variously modified and have various forms, embodiments will be illustrated and described in detail in the following. This, however, by no means restricts the present disclosure to the specific embodiments, and it is to be understood as embracing all included in the spirit and scope of the present disclosure changes, equivalents, and substitutes.

Some embodiments are described in the accompanying drawings in relation to functional blocks, units, and/or modules. Those skilled in the art will understand that these blocks, units, and/or modules are physically implemented by logic circuits, discrete components, microprocessors, hard-wired circuits, memory elements, wire connections, and other electronic circuits. These can be formed by using semiconductor-based manufacturing techniques or other manufacturing techniques. In the case of the blocks, units, and/or modules being implemented by microprocessors or other similar hardware, they may be programmed and controlled by using software to perform various functions discussed herein and may optionally be driven by firmware and/or software. It is also contemplated that each block, unit, and/or module may be implemented by dedicated hardware, or as a combination of dedicated hardware to perform some functions and a processor (for example, one or more programmed microprocessors and associated circuitry) to perform other functions. In addition, each block, unit, and/or module of some embodiments may be physically separated into two or more interacting and discrete blocks, units, and/or modules without departing from the spirit and scope of the present disclosure. Further, the blocks, units, and/or modules of some embodiments may be physically combined into more complex blocks, units, and/or modules without departing from the inventive concepts.

Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the spirit and scope of the present disclosure. Singular forms are intended to include plural forms unless the context clearly indicates otherwise.

In the present application, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. It will be understood that when an element such as a layer, film, region, area, or substrate is referred to as being "on" another element, it can be directly on the other element or intervening elements may also be present. In addition, in the present disclosure, when a portion of a layer, film, region, area, plate, or the like is referred to as being formed "on" another portion, the formed direction is not limited to an upper direction but includes a lateral or lower direction. In contrast, when an element of a layer, film, region, area, plate, or the like is referred to as being "below" another element, it may be directly below the other element, or intervening elements may be present.

Hereinafter, a display device according to one or more embodiments of the present disclosure will be described with reference to drawings related to the embodiment of the present disclosure.

FIG. 1 illustrates a block diagram of a display device according to one or more embodiments.

Referring to FIG. 1, a display device 10 may include a display panel 100, an after-image compensator 200 (or a compensator), and a panel driver 300.

The display device 10 may include a flexible display device, a rollable display device, a curved display device, a transparent display device, and a mirror display device that are implemented with an organic light emitting display device and/or an inorganic light emitting display device.

The display panel 100 includes pixels PX, and may display an image. The display panel 100 may include the pixels PX that are disposed to be connected to scan lines SL1 to SLn, sensing control lines SSL1 to SSLn, and data lines DL1 to DLm. In one or more embodiments, each of the pixels PX may emit color light of one of red, green, and blue. However, this is only an example, and each of the pixels PX may emit light of a color such as cyan, magenta, and yellow.

The after-image compensator 200 may output second data DATA2 (or second image data or compensated image data) based on characteristic data for each pixel (or characteristic data for each element group within the pixel) and accumulated stress data for each pixel. The stress data may include information such as a light emitting time, grayscale (e.g., gray level), luminance, and temperature of the pixels PX. The stress data may be a value calculated corresponding to each of the pixels PX, or a value calculated respectively corresponding to a pixel group, a pixel block, and the like divided by a suitable reference (e.g., a predetermined reference) according to one or more embodiments. The stress data may be stored in a memory 500. The characteristic data for each pixel may include the number of light emitting elements included in the corresponding pixel (or element group within the pixel) or information corresponding thereto. The characteristic data for each pixel is pre-generated based on a captured image, and may be stored in the memory 500. However, the present invention is not limited thereto, and the after-image compensator 200 may generate the characteristic data for each pixel based on the captured image.

In addition, the after-image compensator 200 may generate the accumulated stress data for each pixel by accumulating first data DATA1 (or first image data) or the second data DATA2.

In one or more embodiments, the after-image compensator 200 may be implemented as an independent application processor AP. In another embodiment, at least some or all of constituent elements of the after-image compensator 200 may be included in a timing controller 360. In another embodiment, the after-image compensator 200 may be included in an integrated circuit (IC) including a data driver 340.

In one or more embodiments, the panel driver 300 may include a scan driver 320, the data driver 340, and the timing controller 360.

The scan driver 320 may provide a scan signal to the pixels PX of the display panel 100 through the scan lines SL1 to SLn (and the sensing control lines SSL1 to SSLn). The scan driver 320 may provide a scan signal to the display panel 100 based on a scan control signal SCS received from the timing controller 360.

The data driver 340 may generate a data signal (or a data voltage) based on the second data DATA2, and may provide the data signal to the pixels PX of the display panel 100 through the data lines DL1 to DLm. The data driver 340 may provide a data signal to the display panel 100 based on a data driving control signal DCS received from the timing controller 360. In one or more embodiments, the data driver 340 may convert the second data DATA2 of a digital form into a data signal of an analog form.

The timing controller 360 may receive input image data RGB (or input image data) from an external graphic source and the like, and may convert the image data RGB into the first data DATA1 or may generate the first data DATA1 based on the image data RGB. For example, the timing controller 360 may convert the input image data RGB into the first data DATA1 matching pixel arrangement in the display panel 100. The first data DATA1 may be provided to the after-image compensator 200. In one or more embodiments, the first data DATA1 may be bypassed in the after-image compensator 200 to be provided to the data driver 340.

In addition, the timing controller 360 may control driving of the scan driver 320 and the data driver 340. The timing controller 360 may generate the scan control signal SCS and the data driving control signal DCS.

In one or more embodiments, the panel driver 300 may further include a power supplier that generates a first driving voltage VDD, a second driving voltage VSS, and an initialization voltage VINT for driving the display panel 100.

Figure 2:
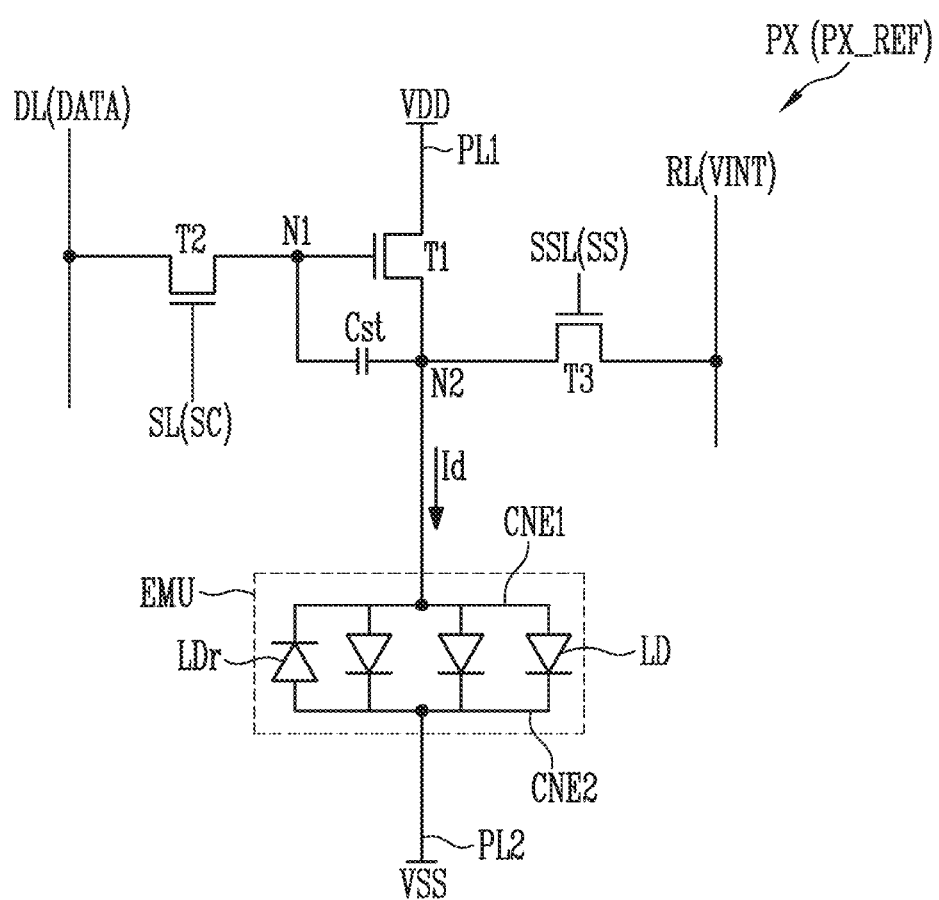
FIG. 2 and FIG. 3 illustrate circuit diagrams of an embodiment of a pixel included in the display device of FIG. 1.
Figure 3:
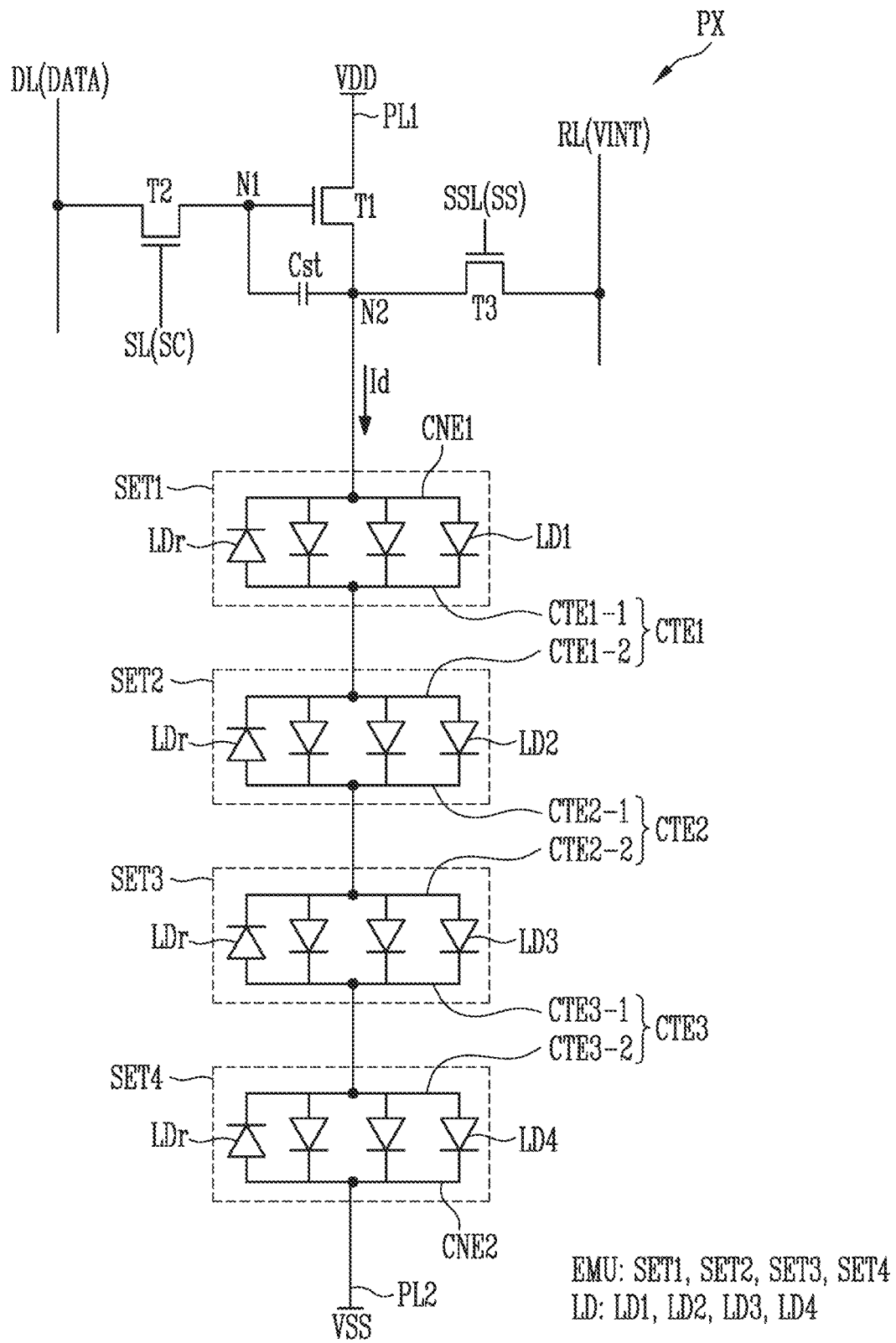

FIG. 2 and FIG. 3 illustrate circuit diagrams of an embodiment of a pixel included in the display device of FIG. 1. FIG. 2 and FIG. 3 illustrate a pixel PX including a light emitting part EMU having different structures.

Referring to FIG. 2 and FIG. 3, the pixel PX may include a first transistor T1, a second transistor T2, a third transistor T3, a storage capacitor Cst, and a light emitting part EMU.

A first electrode of the first transistor T1 (or a driving transistor) may be connected to a first power line PL1, and a second electrode thereof may be connected to a first pixel electrode CNE1 of the light emitting part EMU (or a second node N2). A gate electrode of the first transistor T1 may be connected to a first node N1. In one or more embodiments, the first electrode thereof may be a drain electrode, and the second electrode thereof may be a source electrode. The first transistor T1 may control an amount of a driving current Id flowing to the light emitting part EMU in response to a voltage of the first node N1.

A first electrode of the second transistor T2 (or a switching transistor) may be connected to a data line DL, and a second electrode thereof may be connected to the first node N1 (or the gate electrode of the first transistor T1). A gate electrode of the second transistor T2 may be connected to a first scan line SL. When a first scan signal SC (for example, a high level voltage) is supplied to the first scan line SL, the second transistor T2 may be turned on to transmit a data voltage DATA from the data line DL to the first node N1.

A first electrode of the third transistor T3 may be connected to a sensing line RL, and a second electrode thereof may be connected to the second node N2 (or the second electrode of the first transistor T1). A gate electrode of the third transistor T3 may be connected to a second scan line SSL (or a sensing control line). During a suitable sensing period (e.g., a predetermined sensing period), when a second scan signal SS (for example, a high level voltage) is supplied to the second scan line SSL, the third transistor T3 may be turned on to electrically connect the sensing line RL and the second node N2.

The storage capacitor Cst is connected between the first node N1 and the second node N2. The storage capacitor Cst may be charged with the data voltage DATA corresponding to a data signal supplied to the first node N1 during one frame. Accordingly, the storage capacitor Cst may store a voltage corresponding to a voltage difference between the first node N1 and the second node N2. For example, the storage capacitor Cst may store a voltage corresponding to a difference between the data voltage DATA supplied to the gate electrode of the first transistor T1 and the initialization voltage VINT supplied to the second electrode of the first transistor T1.

The light emitting part EMU may include a plurality of light emitting elements LD connected in series and/or in parallel between the first power line PL1 to which the first driving voltage VDD is applied and the second power line PL2 to which the second driving voltage VSS is applied. Among a plurality of light emitting elements LD connected in parallel, each light emitting element LD connected in the same direction may configure an effective light source.

The light emitting element LD may be an inorganic light emitting element including an inorganic light emitting material or a light emitting element that emits light by changing a wavelength of light emitted by using a quantum dot. However, the present disclosure is not limited thereto, and for example, the light emitting element LD may be an organic light emitting diode.

In one or more embodiments, the light emitting element LD may be a rod-shaped light emitting diode manufactured in a rod shape. In the present disclosure, "rod shape" refers to a rod-like shape or bar-like shape (that is, with an aspect ratio of greater than 1) that is long in a length direction, such as a circular cylinder or a polygonal cylinder, but a shape of a cross section thereof is not particularly limited. For example, a length of the light emitting element LD may be larger than a diameter D thereof (or a width of a lateral cross-section thereof). In one or more embodiments, the light emitting element LD may have a size as small as nano-scale or micro-scale. Each light emitting element LD may have a diameter and/or a length ranging from a nano scale to a micro scale. For example, the length of the light emitting element LD may be about 100 nm to 10 µm, the diameter of the light emitting element LD may be about 200 nm to 600 nm, and the aspect ratio of the light emitting element LD may range from about 1.2 to about 100. However, the size of the light emitting element LD in the present disclosure is not limited thereto.

The light emitting part EMU may include the light emitting elements LD connected in series and/or in parallel between the first pixel electrode CNE1 (or the first contact electrode) connected to the second node N2 and the second pixel electrode CNE2 (or the second contact electrode) connected to the second power line PL2. Here, the first pixel electrode CNE1 may be an anode, and the second pixel electrode CNE2 may be a cathode.

In one or more embodiments, as shown in FIG. 2, the light emitting part EMU may include the light emitting element LD connected in parallel between the first pixel electrode CNE1 and the second pixel electrode CNE2. In addition, the light emitting part EMU may further include a reverse direction light emitting element LDr connected in an opposite direction to the light emitting element LD between the first pixel electrode CNE1 and the second pixel electrode CNE2. The pixel PX including only the light emitting elements LD connected in parallel will be referred to as a reference pixel PX_REF.

The light emitting part EMU may generate light of a desired luminance (e.g., a predetermined luminance) in response to the driving current Id supplied from the first transistor T1. For example, during one frame period, the first transistor T1 may supply the driving current Id corresponding to a grayscale value (e.g., gray level or gray value) of the corresponding frame data (for example, the second data DATA2 (see FIG. 1)) to the light emitting part EMU. The driving current Id supplied to the light emitting part EMU may be divided to flow in the light emitting elements LD. Therefore, while each light emitting element LD emits light with a luminance corresponding to the current flowing therein, the light emitting part EMU may emit light having a luminance corresponding to the driving current Id.

In one or more embodiments, the light emitting part EMU may include element groups (or serial terminals) connected in series between the second node N2 and the second power line PL2. Each of the element groups may include a light emitting element LD connected in parallel. For example, the light emitting part EMU may include two, three, four, five or more element groups connected in series to each other.

As shown in FIG. 3, the light emitting part EMU may include first to fourth element groups SET1 to SET4 connected between the second node N2 and the second power line PL2. The first element group SET1 may include at least one first light emitting element LD1 connected in the same direction between the first pixel electrode CNE1 and a (1-1)-th middle electrode CTE1-1. The second element group SET2 may include at least one second light emitting element LD2 connected in the same direction between a (1-2)-th middle electrode CTE1-2 and a (2-1)-th middle electrode CTE2-1. The (1-2)-th middle electrode CTE1-2 and the (1-1)-th middle electrode CTE1-1 are connected or integrally formed, and may configure the first middle electrode CTE1. The third element group SET3 may include at least one third light emitting element LD3 connected in the same direction between a (2-2)-th middle electrode CTE2-2 and a (3-1)-th middle electrode CTE3-1. The (2-2)-th middle electrode CTE2-2 and the (2-1)-th middle electrode CTE2-1 are connected or integrally formed, and may configure the second middle electrode CTE2. The fourth element group SET4 may include at least one fourth light emitting element LD4 connected in the same direction between a (3-2)-th middle electrode CTE3-2 and the second pixel electrode CNE2. The (3-2)-th middle electrode CTE3-2 and the (3-1)-th middle electrode CTE3-1 are connected or integrally formed, and may configure the third middle electrode CTE3. In addition, each of the first to fourth element groups SET1 to SET4 may further include a reverse light emitting element LDr connected in the opposite direction to the light emitting elements LD.

The driving current Id supplied to the light emitting part EMU may be divided to flow through the light emitting elements LD for each element group. Therefore, while each light emitting element LD emits light with a luminance corresponding to the current flowing therein, the light emitting part EMU may emit light having a luminance corresponding to the driving current Id.

FIG. 2 and FIG. 3 illustrate the transistor as an NMOS, but the present disclosure is not limited thereto. For example, at least one of the first to third transistors T1 to T3 may be implemented as a PMOS. In one or more embodiments, the pixel PX may further include a transistor for initializing the first node N1, a transistor for adjusting the light emitting time, and the like, or in order to perform these functions, the circuit of the pixel PX (that is, the pixel circuit for supplying the driving current Id to the light emitting part EMU) may be variously changed.

Figure 4:
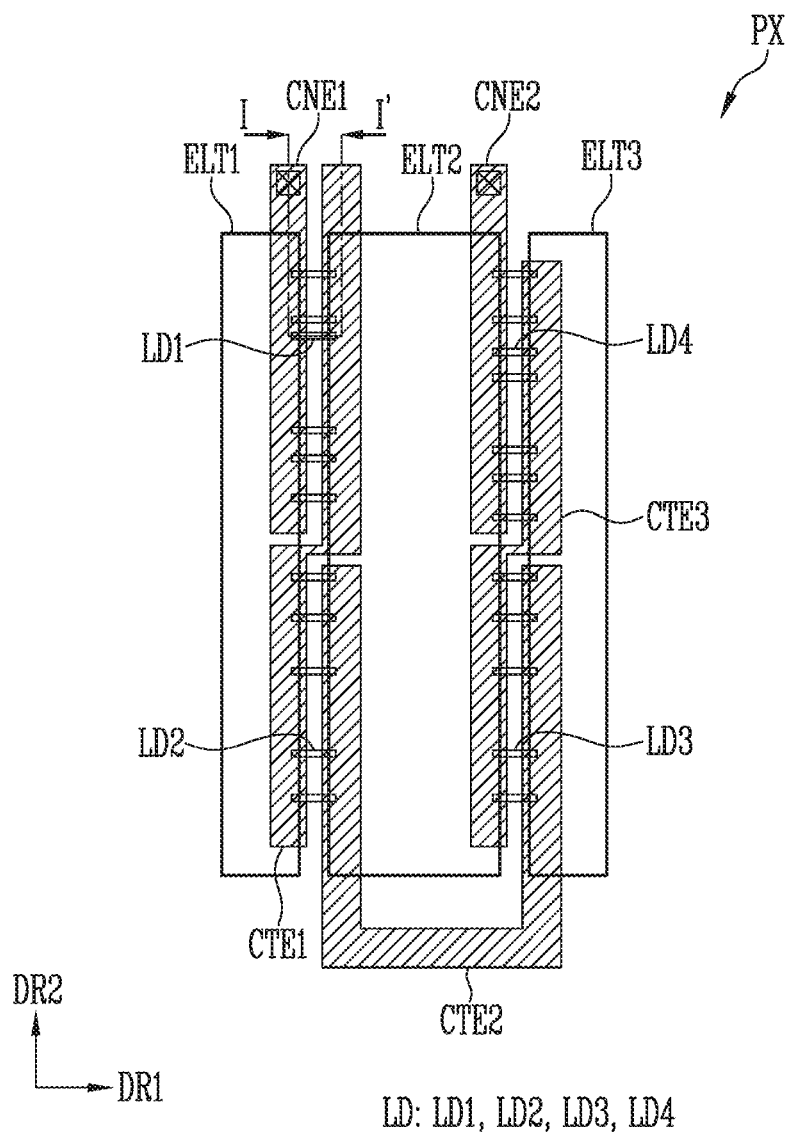
FIG. 4 illustrates a top plan view of an embodiment of the pixel of FIG. 3.

FIG. 4 illustrates a top plan view of an embodiment of the pixel of FIG. 3. In FIG. 4, the pixel PX of FIG. 3 is briefly illustrated centering on the light emitting part EMU (see FIG. 3).

Referring to FIG. 3 and FIG. 4, the pixel PX may include first to third electrodes ELT1 to ELT3 (or alignment electrodes), the light emitting element LD, the first and second pixel electrodes CNE1 and CNE2, and the first to third middle electrodes CTE1 to CTE3.

Each of the first to third electrodes ELT1 to ELT3 extends in a second direction DR2, and the first to third electrodes ELT1 to ELT3 may be spaced from each other along a first direction DR1. The second electrode ELT2 may be positioned to be spaced from the first electrode ELT1 in the first direction DR1. The third electrode ELT3 may be positioned to be spaced from the second electrode ELT2 in the first direction DR1.

The first to third electrodes ELT1 to ELT3 may be used as an alignment electrode by applying an alignment voltage after a mixed solution (for example, ink) including the light emitting element LD is injected into a pixel area PXA (or a light emitting area). The first electrode ELT1 may be a first alignment electrode, the second electrode ELT2 may be a second alignment electrode, and the third electrode ELT3 may be a third alignment electrode. The first light emitting element LD1 and the second light emitting element LD2 may be aligned in a desired direction and/or position by an electric field formed between the first alignment electrode ELT1 and the second alignment electrode ELT2. Similarly, the third light emitting element LD3 and the fourth light emitting element LD4 may be aligned in a desired direction and/or position by an electric field formed between the second alignment electrode ELT2 and the third alignment electrode ELT3. In one or more embodiments, the first to third electrodes ELT1 to ELT3 may be used as driving electrodes for driving the light emitting elements LD after the light emitting elements LD are aligned. In this case, one of the first to third electrodes ELT1 to ELT3 may configure the anode of the light emitting part EMU, and the other one of the first to third electrodes ELT1 to ELT3 may configure the cathode of the light emitting part EMU. For example, the first electrode ELT1 may configure the anode of the light emitting part EMU, and may be connected to the first transistor T1 of FIG. 3 through a contact hole or the like. For example, the second electrode ELT2 may configure the cathode of the light emitting part EMU, and may be connected to the second power line PL2 of FIG. 3 through a contact hole or the like.

The first to third electrodes ELT1 to ELT3 may have a bar shape extending along the second direction DR2 when viewed in a plan view, but the present disclosure is not limited thereto. The shapes of the first to third electrodes ELT1 to ELT3 may be variously changed.

Each of the light emitting elements LD may be disposed between adjacent ones of the first to third electrodes ELT1 to ELT3 such that a length direction of each of the light emitting elements LD is substantially parallel to the first direction DR1. For example, the first light emitting element LD1 and the second light emitting element LD2 may be disposed between the first electrode ELT1 and the second electrode ELT2, and the third light emitting element LD3 and the fourth light emitting element LD4 may be disposed between the second electrode ELT2 and the third electrode ELT3.

The first pixel electrode CNE1 may be positioned to overlap a first end portion of each of the first light emitting elements LD1 and the first electrode ELT1. In one or more embodiments, the first pixel electrode CNE1 may physically and/or electrically connect the first end portion of the first light emitting element LD1 and the first electrode ELT1. However, it is not limited thereto, and for example, the first pixel electrode CNE1 may be electrically separated from the first electrode ELT1. The first pixel electrode CNE1 configures an anode of the light emitting part EMU (see FIG. 5), and may be connected to the first transistor T1 of FIG. 3 through a contact hole or the like. The first pixel electrode CNE1 may extend in the second direction DR2 to correspond to the first electrode ELT1.

The first middle electrode CTE1 may be positioned to overlap the second end portion of the first light emitting element LD1 and the second electrode ELT2. In addition, the first middle electrode CTE1 may be positioned to overlap the first end portion of the second light emitting element LD2 and the first electrode ELT1. To this end, a portion of the first middle electrode CTE1 may have a curved shape. The first middle electrode CTE1 may physically and/or electrically connect the second end portion of the first light emitting element LD1 and the first end of the second light emitting element LD2.

The second middle electrode CTE2 may be positioned to overlap the second end portion of the second light emitting element LD2 and the second electrode ELT2. In addition, the second middle electrode CTE2 may be positioned to overlap the first end portion of the third light emitting element LD3 and the third electrode ELT3. The second middle electrode CTE2 may have a shape bypassing the third middle electrode CTE3. The second middle electrode CTE2 may physically and/or electrically connect the second end portion of the second light emitting element LD2 and the first end portion of the third light emitting element LD3.

The third middle electrode CTE3 may be positioned to overlap the second end portion of the third light emitting element LD3 and the second electrode ELT2. In addition, the third middle electrode CTE3 may be positioned to overlap the first end portion of the fourth light emitting element LD4 and the third electrode ELT3. To this end, a portion of the third middle electrode CTE3 may have a curved shape. The third middle electrode CTE3 may physically and/or electrically connect the second end portion of the third light emitting element LD3 and the first end portion of the fourth light emitting element LD4.

The second pixel electrode CNE2 may be positioned to overlap the second end portion of each of the fourth light emitting elements LD4 and the second electrode ELT2. In one or more embodiments, the second pixel electrode CNE2 may physically and/or electrically connect the second end portion of the fourth light emitting element LD4 and the second electrode ELT2. However, it is not limited thereto, and for example, the second pixel electrode CNE2 may be electrically separated from the second electrode ELT2. The second pixel electrode CNE2 configures the cathode of the light emitting part EMU (see FIG. 3), and may be connected to the second power line PL2 of FIG. 3 through a contact hole or the like. The second pixel electrode CNE2 may extend in the second direction DR2 to correspond to the second electrode ELT2.

The shapes of the first and second pixel electrodes CNE1 and CNE2 and the first to third middle electrodes CTE1 to CTE3 may be variously changed within a range that is electrically stably connected to each of the light emitting elements LD.

Figure 5:
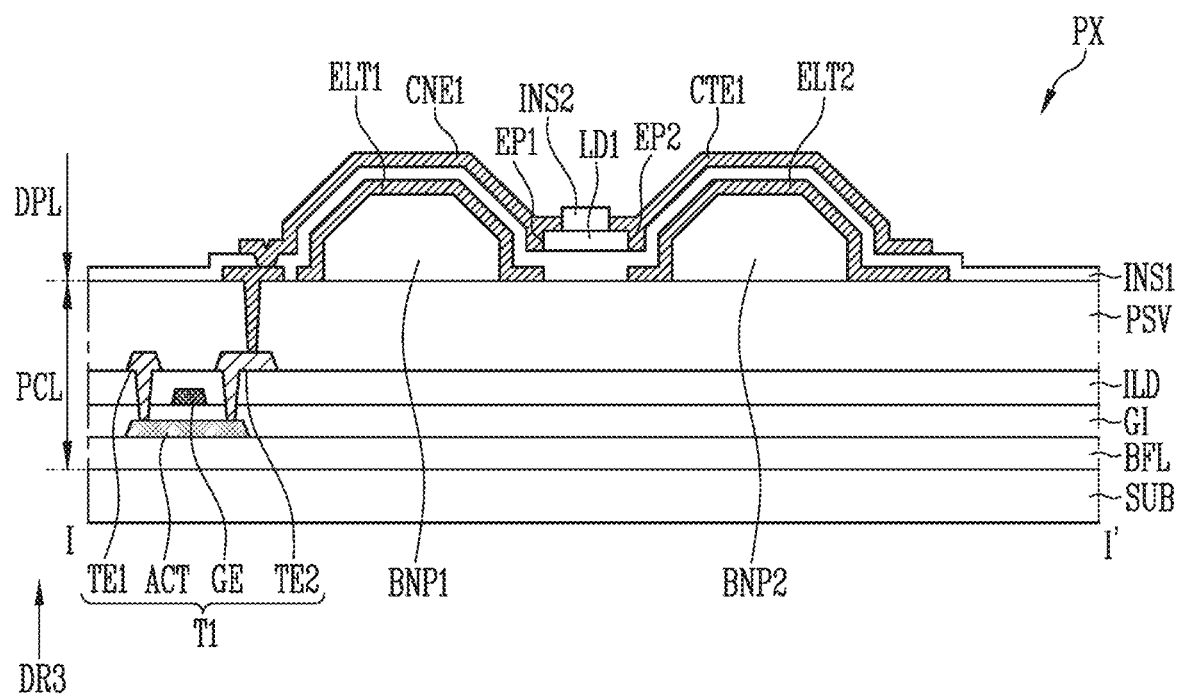
FIG. 5 illustrates a cross-sectional view of an embodiment of a pixel taken along the line I-I' of FIG. 4.

FIG. 5 illustrates a cross-sectional view of an embodiment of a pixel taken along the line I-I' of FIG. 4.

In FIG. 5, the pixel PX is simplified by showing each electrode as an electrode of a single film and each insulating layer as an insulating layer of a single film, but the present disclosure is not limited thereto. In addition, in one or more embodiments of the present disclosure, "connection" between two elements may comprehensively mean both electrical and physical connections.

Referring to FIG. 4 and FIG. 5, the pixel PX may include a pixel circuit layer PCL and a display element layer DPL that are disposed on a substrate SUB.

The substrate SUB configures a base member, and may be a rigid or flexible substrate or film. For example, the substrate SUB may be a hard substrate made of glass or tempered glass, a flexible substrate (or a thin film) made of a plastic or metallic material, or at least one layered insulating layer.

The pixel circuit layer PCL may include a first transistor T1. In addition, the pixel circuit layer PCL may include a plurality of insulating layers BFL, GI, ILD, and PSV. The first transistor T1 may include a semiconductor pattern ACT, a gate electrode GE, and first and second transistor electrodes TE1 and TE2 (or first and second terminals).

The buffer layer BFL may be disposed on the substrate SUB. The buffer layer BFL may prevent impurities from diffusing into the circuit element. The buffer layer BFL may be formed as a single layer, but may also be formed as a multilayer of at least double layers or more. When the buffer layer BFL is formed as the multilayer, respective layers may be made of the same material or different materials.

The semiconductor pattern ACT may be disposed on the buffer layer BFL. For example, the semiconductor pattern ACT may include a first area contacting the first transistor electrode TE1, a second area contacting the second transistor electrode TE2, and a channel area disposed between the first and second areas. In one or more embodiments, one of the first and second areas may be a source area, and the other one thereof may be a drain area.

In one or more embodiments, the semiconductor pattern ACT may be made of polysilicon, amorphous silicon, an oxide semiconductor, or the like. In addition, the channel area of the semiconductor pattern ACT may be an intrinsic semiconductor as a semiconductor pattern that is not doped with impurities, and each of the first and second areas of the semiconductor pattern ACT may be a semiconductor doped with suitable impurities (e.g., a predetermined impurities).

The gate insulating layer GI may be disposed on the semiconductor pattern ACT and the buffer layer BFL. For example, the gate insulating layer GI may be disposed between the semiconductor pattern ACT and the gate electrode GE. Each of the gate insulating layer GI and the interlayer insulating layer ILD may be configured of a single layer or a multilayer, and may include an inorganic material. The inorganic material may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), a titanium oxide (TiOx), or the like.

The gate electrode GE may be disposed on the gate insulating layer GI. The gate electrode GE may overlap the semiconductor pattern ACT in a third direction DR3.

Each of the gate electrode GE and the first and second transistor electrodes TE1 and TE2 may be formed as a single layer or multilayer made of molybdenum (Mo), copper (Cu), aluminum (Al), chromium (Cr), gold (Au), titanium (Ti), nickel (Ni), neodymium (Nd), indium (In), tin (Sn), and an oxide thereof or an alloy thereof. For example, the gate electrode GE may be formed as a multilayer in which titanium (Ti), copper (Cu), and/or an indium tin oxide (ITO) are sequentially or repeatedly stacked.

The interlayer insulating layer ILD may be disposed on the gate electrode GE and the gate insulating layer GI. For example, the interlayer insulating layer ILD may be disposed between the gate electrode GE and the first and second transistor electrodes TE1 and TE2.

The first and second transistor electrodes TE1 and TE2 may be disposed on the interlayer insulating layer ILD. The first and second transistor electrodes TE1 and TE2 may overlap the semiconductor pattern ACT in the third direction DR3. The first and second transistor electrodes TE1 and TE2 may be electrically connected to the semiconductor pattern ACT. For example, the first transistor electrode TE1 may be electrically connected to the first area of the semiconductor pattern ACT through a contact hole penetrating the interlayer insulating layer ILD and the gate insulating layer GI. The second transistor electrode TE2 may be electrically connected to the second area of the semiconductor pattern ACT through a contact hole penetrating the interlayer insulating layer ILD and the gate insulating layer GI. In one or more embodiments, one of the first and second transistor electrodes TE1 and TE2 may be a source electrode, and the other one thereof may be a drain electrode.

The passivation layer PSV (or a via layer) may be disposed on the first and second transistor electrodes TE1 and TE2.

The passivation layer PSV may be made of an organic material in order to flatten a lower step thereof. For example, the organic material may include an acrylates resin, an epoxy resin, a phenolic resin, a polyamides resin, a polyimide resin, a polyesters resin, a polyphenylenesulfides resin, a benzocyclobutene (BCB), or the like. However, it is not necessarily limited thereto, and the passivation layer PSV may include an inorganic material. Alternatively, an insulating layer including the inorganic material may be disposed between the passivation layer PSV including the organic material and the first and second transistor electrodes TE1 and TE2.

The display element layer DPL may be disposed on the passivation layer PSV. The display element layer DPL may include first and second bank patterns BNP1 and BNP2, first and second electrodes ELT1 and ELT2, a first insulating layer INS1, a first light emitting element LD1 (or a light emitting element), a second insulating layer INS2 (or, a second insulating pattern), a first pixel electrode CNE1, and a first middle electrode CTE1.

The first and second bank patterns BNP1 and BNP2 may serve to form a suitable step (e.g., a predetermined step) to be able to easily align the first light emitting elements LD1. In addition, the first and second bank patterns BNP1 and BNP2 may be a support member supporting the first and second electrodes ELT1 and ELT2 in order to change surface profiles (or shapes) of the first and second electrodes ELT1 and ELT2 so that light emitted from the first light emitting elements LD1 is guided in an image display direction (for example, the third direction DR3) of the display device.

The first and second bank patterns BNP1 and BNP2 may have various shapes according to one or more embodiments. In one or more embodiments, the first and second bank patterns BNP1 and BNP2 may have a shape protruding in the third direction DR3 on the substrate SUB. In addition, the first and second bank patterns BNP1 and BNP2 may be formed to have an inclined surface inclined at a suitable angle (e.g., a predetermined angle) with respect to the substrate SUB. However, the present disclosure is not necessarily limited thereto, and the first and second bank patterns BNP1 and BNP2 may have a side wall having a curved surface or a step shape. For example, the first and second bank patterns BNP1 and BNP2 may have a semi-circular or semi-elliptical cross-section.

The first and second bank patterns BNP1 and BNP2 may include at least one organic and/or inorganic material.

The first and second electrodes ELT1 and ELT2 may be disposed on the passivation layer PSV and the first and second bank patterns BNP1 and BNP2. For example, the first electrode ELT1 may be disposed on the first bank pattern BNP1, and the second electrode ELT2 may be disposed on the second bank pattern BNP2.

The first and second electrodes ELT1 and ELT2 may at least partially cover side and/or upper surfaces of the first and second bank patterns BNP1 and BNP2. The first and second electrodes ELT1 and ELT2 may have a shape corresponding to the first and second bank patterns BNP1 and BNP2. For example, the first and second electrodes ELT1 and ELT2 may include an inclined surface or a curved surface having a shape corresponding to the shape of the first and second bank patterns BNP1 and BNP2. In this case, the first and second electrodes ELT1 and ELT2 and the first and second bank patterns BNP1 and BNP2, as a reflective member, may reflect light emitted from the first light emitting elements LD1 to guide it in a front direction of the pixel PX, that is, in the third direction DR3, so that the light output efficiency of the display device may be improved.

The first and second electrodes ELT1 and ELT2 may include at least one conductive material. For example, the electrodes ELT1 to ELT3 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), an indium tin zinc Oxide (ITZO), an aluminum zinc oxide (AZO), a gallium zinc oxide (GZO), a zinc tin oxide (ZTO), or a gallium tin oxide (GTO); and at least one conductive material from among conductive polymers such as poly(3, 4-ethylenedioxythiophene) (PEDOT), but are not necessarily limited thereto.

The first insulating layer INS1 may be disposed on the first and second electrodes ELT1 and ELT2. The first insulating layer INS1 may be configured as a single layer or a multilayer, and may include an inorganic material.

The first light emitting elements LD1 may be disposed on the first insulating layer INS1. The first light emitting element LD1 may be disposed between the first and second bank patterns BNP1 and BNP2 and/or between the first and second electrodes ELT1 and ELT2. In one or more embodiments, the first light emitting elements LD1 may partially overlap the first and second electrodes ELT1 and ELT2 in the third direction DR3.

The first light emitting elements LD1 may be prepared in a dispersed form in a light emitting element ink to be supplied to the pixel PX through an inkjet printing method or the like. For example, the first light emitting elements LD1 may be dispersed in a volatile solvent to be provided to the pixel PX. Subsequently, when an alignment signal is supplied to the first and second electrodes ELT1 and ELT2 as described above, an electric field is formed between the first and second electrodes ELT1 and ELT2, so that the first light emitting elements LD1 may be aligned between the first and second electrodes ELT1 and ELT2. After the first light emitting elements LD1 are aligned, the first light emitting elements LD1 may be stably arranged by volatilizing the solvent or removing the solvent by other methods.

The second insulating layer INS2 may be disposed on the first light emitting elements LD1. For example, the second insulating layer INS2 may be partially provided on the first light emitting elements LD1, and may expose first and second end portions EP1 and EP2 of the first light emitting elements LD1. After the alignment of the first light emitting elements LD1 is completed, when the second insulating layer INS2 is formed on the first light emitting elements LD1, it is possible to prevent the first light emitting elements LD1 from deviating from the aligned position. In one or more embodiments, the second insulating layer INS2 may be omitted.

The second insulating layer INS2 may include an organic material. However, the present disclosure is not necessarily limited thereto, and the second insulating layer INS2 may include an inorganic material.

The first pixel electrode CNE1 and the first middle electrode CTE1 may be disposed on the first and second end portions EP1 and EP2 of the first light emitting element LD1 exposed by the second insulating layer INS2.

The first pixel electrode CNE1 may be directly disposed on the first end portion EP1 of the first light emitting element LD1 to contact the first end portion EP1 of the first light emitting element LD1. The first pixel electrode CNE1 may be electrically connected to the second transistor electrode TE2 of the first transistor T1 through a contact hole penetrating the passivation layer PSV. In one or more embodiments, the first pixel electrode CNE1 may be electrically connected to the second transistor electrode TE2 of the first transistor T1 through a bridge electrode disposed on (or at) the same layer as the first electrode ELT1.

The first middle electrode CTE1 may be directly disposed on the second end portion EP2 of the first light emitting element LD1 to contact the second end portion EP2 of the first light emitting element LD1.

The first pixel electrode CNE1 and the first middle electrode CTE1 may be made of various transparent conductive materials. Accordingly, light emitted from the first and second end portions EP1 and EP2 of the first light emitting elements LD1 may pass through the first pixel electrode CNE1 and the first middle electrode CTE1 to be emitted to the outside in the third direction DR3. The transparent conductive material may include a conductive oxide such as an indium tin oxide (ITO), an indium zinc oxide (IZO), a zinc oxide (ZnO), an indium gallium zinc oxide (IGZO), and an indium tin zinc oxide (ITZO), and a conductive polymer such as PEDOT.

In one or more embodiments, the first pixel electrode CNE1 and the first middle electrode CTE1 may be configured of the same conductive layer as each other. For example, the first pixel electrode CNE1 and the first middle electrode CTE1 may be concurrently (e.g., simultaneously) formed in the same process. In this case, the number of masks may be reduced and the manufacturing process may be simplified. However, the present disclosure is not limited thereto, and first pixel electrode CNE1 and first middle electrode CTE1 may be configured of mutually different conductive layers with an insulating layer therebetween.

In one or more embodiments, an overcoat layer may be disposed on the first pixel electrode CNE1 and the first middle electrode CTE1. The overcoat layer may be an inorganic insulating film including an inorganic material or an organic insulating film including an organic material. For example, the overcoat layer may have a structure in which at least one inorganic insulating film and at least one organic insulating film are alternately stacked. The overcoat layer may entirely cover the display element layer DPL to block impurities or moisture from the outside from being introduced into the display element layer DPL including the first light emitting element LD1. The overcoat layer may flatten an upper surface of the display element layer DPL.

In one or more embodiments, the display element layer DPL may selectively further include an optical layer, or the optical layer may be further disposed on the display element layer DPL. For example, the display element layer DPL may further include a color converting layer including color converting particles (for example, quantum dots) that convert light emitted from the first light emitting elements LD1 into light of a specific color (or a specific wavelength band). In addition, the display element layer DPL may further include a color filter that transmits only light of a specific wavelength band.

Figure 6:
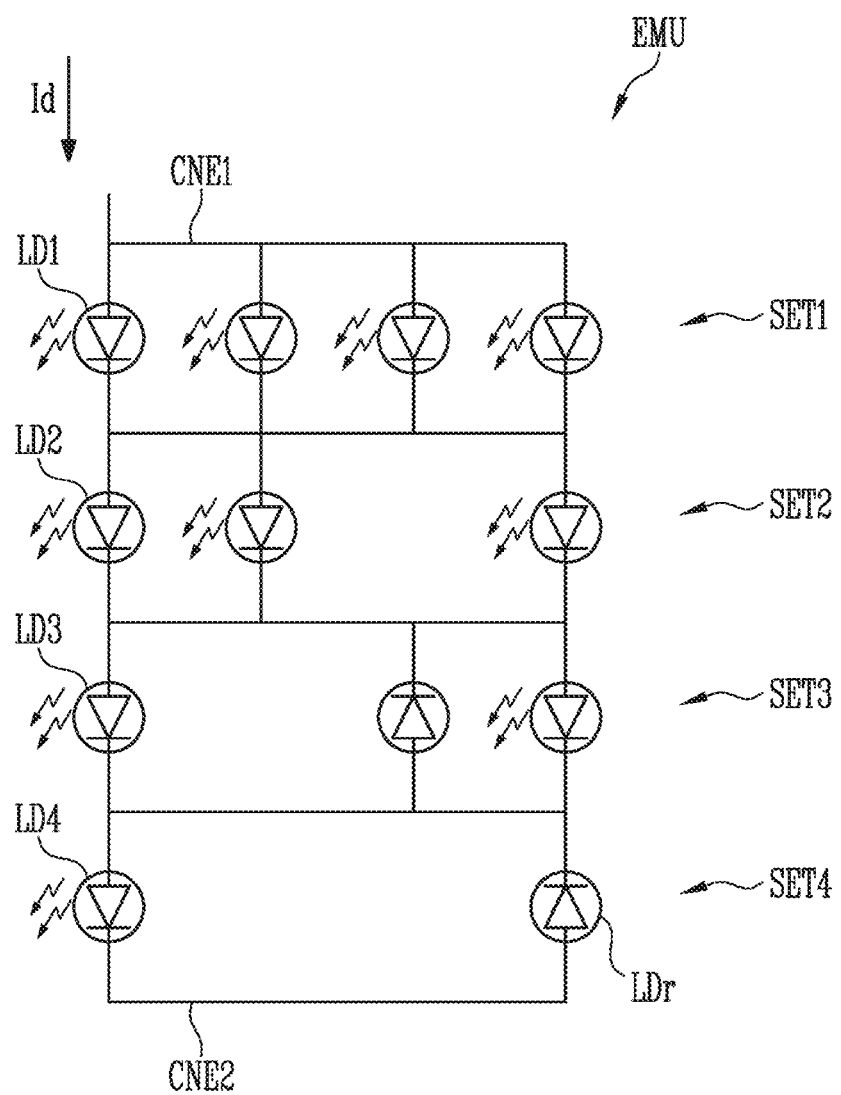
FIG. 6 illustrates an example of a light emitting part included in the pixel of FIG. 3.
Figure 7:
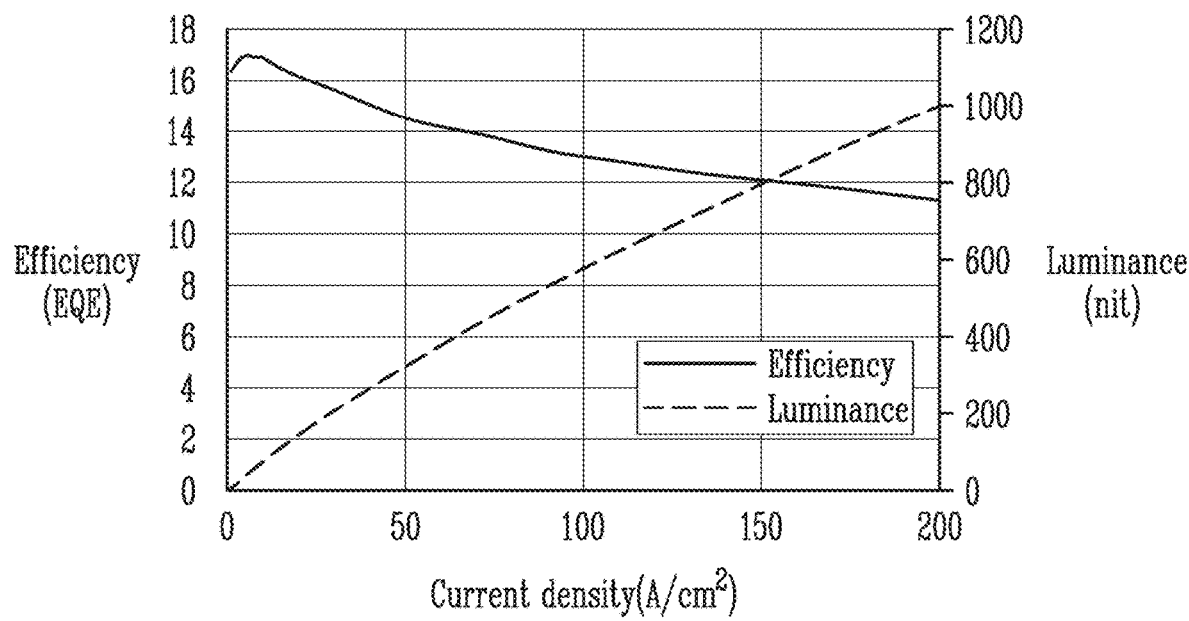
FIG. 7 illustrates a graph current density and light emitting efficiency.
Figure 8:
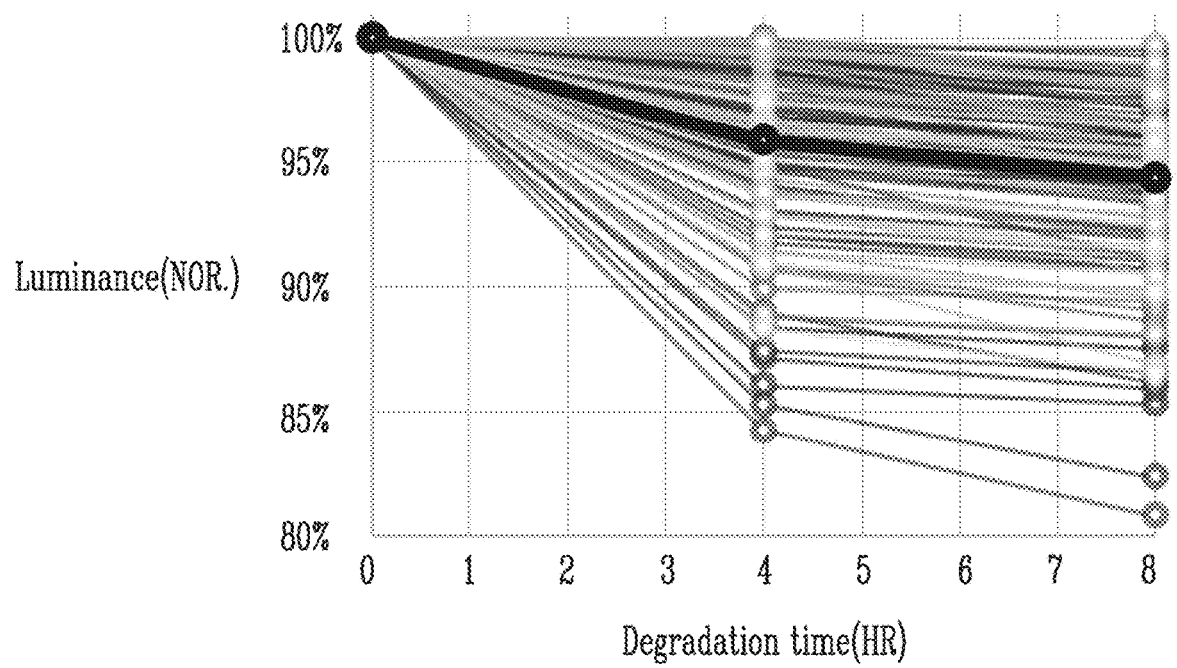
FIG. 8 illustrates a graph of luminance of a pixel according to a degradation time.

FIG. 6 illustrates an example of a light emitting part included in the pixel of FIG. 3. FIG. 7 illustrates a graph current density and light emitting efficiency. FIG. 8 illustrates a graph of luminance of a pixel according to a degradation time.

First, referring to FIG. 3 and FIG. 6, at least some of the number of first light emitting elements LD1 in a first element group SET1, the number of second light emitting elements LD2 in a second element group SET2, the number of third light emitting elements LD3 in a third element group SET3, and the number of fourth light emitting elements LD4 in a fourth element group SET4 may be the same as or different from each other. Accordingly, at least some of a current flowing through the first light emitting element LD1, a current flowing through the second light emitting element LD2, a current flowing through the third light emitting element LD3, and a current flowing through the fourth light emitting element LD4 may be the same or different.

For example, except for the reverse direction light emitting element LDr, the number of the first light emitting elements LD1 in the first element group SET1 may be 4, the number of the second light emitting elements LD2 in the second element group SET2 may be 3, the number of the third light emitting elements LD3 in the third element group SET3 may be 2, and the number of the fourth light emitting elements LD4 in the fourth element group SET4 may be 1.

The driving current Id supplied to the light emitting part EMU may be divided and flow to the first light emitting elements LD1 in the first element group SET1, may be divided and flow to the second light emitting elements LD2 in the second element group SET2, and may be divided and flow to the third light emitting elements LD3, and may be divided and flow to the fourth light emitting elements LD4 in the fourth element group SET4. Accordingly, an amount of a current flowing through each of the light emitting elements may be inversely proportional to the number of light emitting elements in each of the element groups.

In this case, an amount of a first current flowing through each of the first light emitting elements LD1, an amount of a second current flowing through each of the second light emitting elements LD2, an amount of a third current flowing through each of the third light emitting elements LD3, and an amount of a fourth current flowing through each of the fourth light emitting elements LD4 may be different. In other words, a first current density of the first element group SET1 (or the first light emitting element LD1), a second current density of the second element group SET2 (or the second light emitting element LD2), a third current density of the third element group SET3 (or the third light emitting element LD3), and a fourth current density of the fourth element group SET4 (or the fourth light emitting element LD4) may be different from each other. The current density may mean an amount of a current relative to an area corresponding to a light emitting element. The current density may be inversely proportional to the number of light emitting elements.

Referring to FIG. 7, as the current density of the light emitting element (or the element group) increases, luminance increases, and as the current density increases, light emitting efficiency (or external quantum efficiency (EQE)) may generally decrease. However, the relationship between the current density and the light emitting efficiency is not limited thereto. Due to characteristics of a self-luminous material (for example, an inorganic light emitting material) of the light emitting element, the light emitting efficiency may vary depending on the current density. The unit and size of each of the current density, luminance, and efficiency are as shown in FIG. 7, which may vary depending on the self-luminous material, and thus a related description will be omitted.

Even if the driving current flowing through the pixel is the same (that is, under the same driving current of the pixel), the current density may vary according to the number of light emitting elements included in the element group. Accordingly, even if the same current flows through the element groups or the pixels, the element groups or the pixels may be differently degraded according to the number of light emitting elements.

Referring to FIG. 8, it is possible to check luminance transition according to a degradation time of the pixel. The luminance is expressed by being normalized based on an initial luminance, and the unit of the degradation time may be a time (HR), but is not limited thereto. Typically, because the light emitting element is degraded according to the passage of time and the current (or current density), the luminance of the pixel may decrease. Because the pixels (or the element groups) include different numbers of light emitting elements and thus have different current densities, a degree of decrease in luminance over time may be different for each pixel (or element group). Accordingly, it is necessary to perform after-image compensation of a display device by reflecting (e.g., applying) degradation distribution information for each pixel, such as the number of light emitting elements, the current density (and/or, light emitting efficiency), and the like.

For reference, the number of light emitting elements may be individually counted, but time and cost (for example, high-resolution image capturing equipment) are required for counting, so the number of light emitting elements may be calculated or predicted based on the light emitting area.

Hereinafter, a configuration for generating characteristic data for each pixel including information corresponding to the number of light emitting elements will be described with reference to FIG. 9 to FIG. 13C, and a configuration for performing after-image compensation based on characteristic data for each pixel will be described with reference to FIG. 14.

Figure 9:
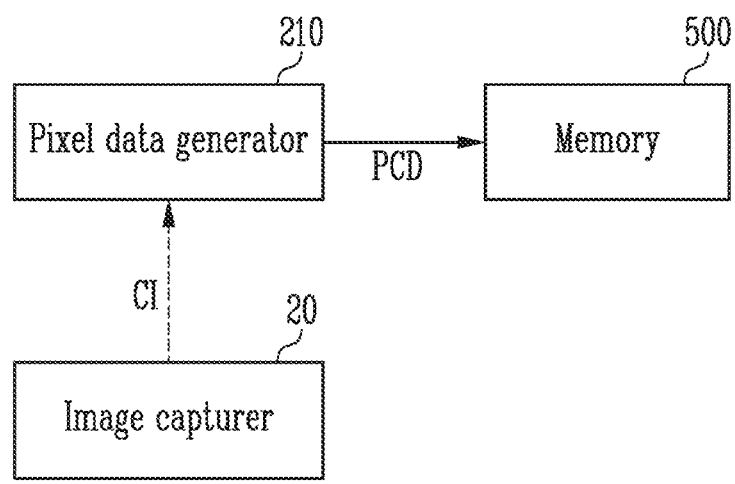
FIG. 9 illustrates an embodiment of an after-image compensator included in the display device of FIG. 1.
Figure 10:
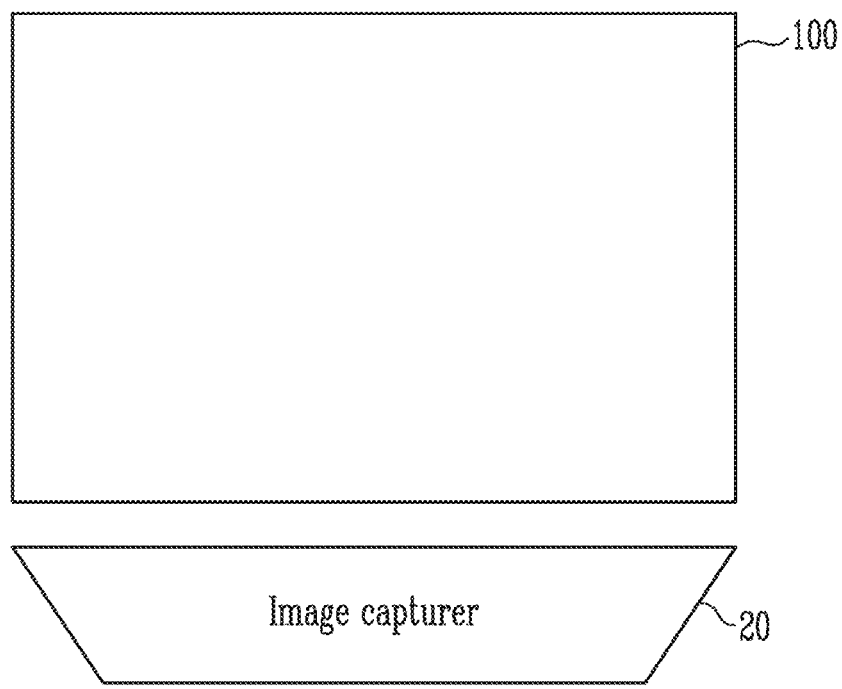
FIG. 10 illustrates a state of capturing a display panel according to one or more embodiments.
Figure 11:
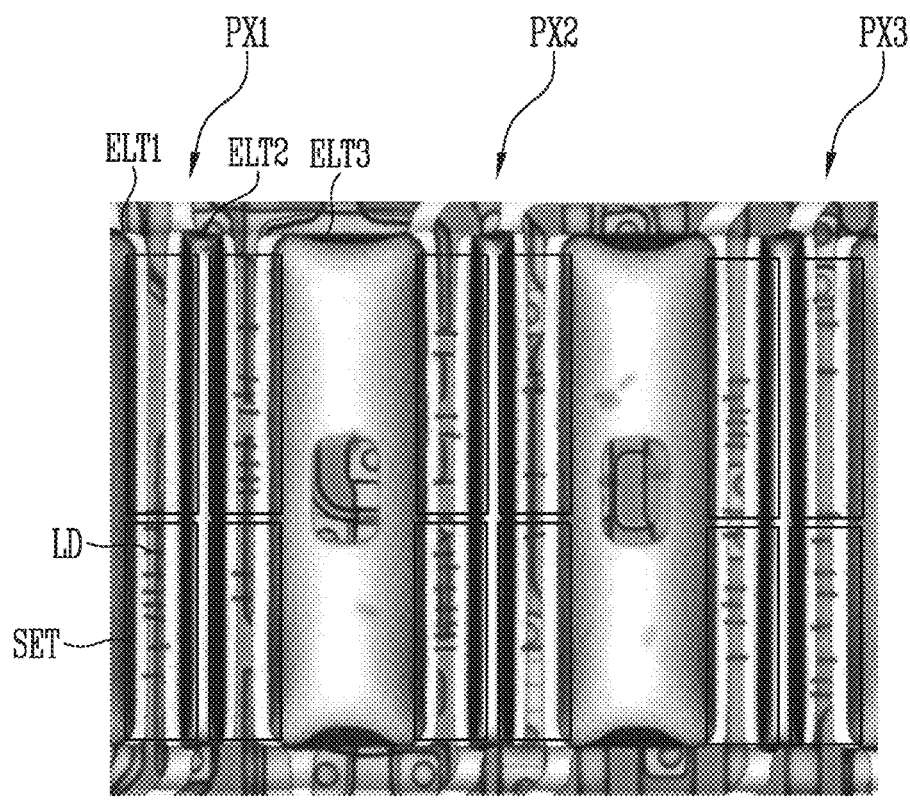
FIG. 11, FIG. 12A, and FIG. 12B illustrate images for explaining an operation of a pixel data generator of FIG. 9.
Figure 12A:
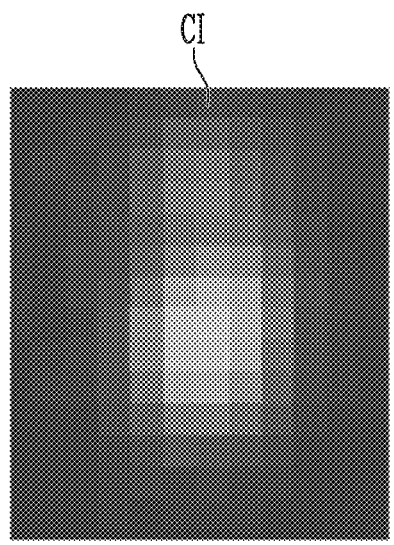
Figure 12B:
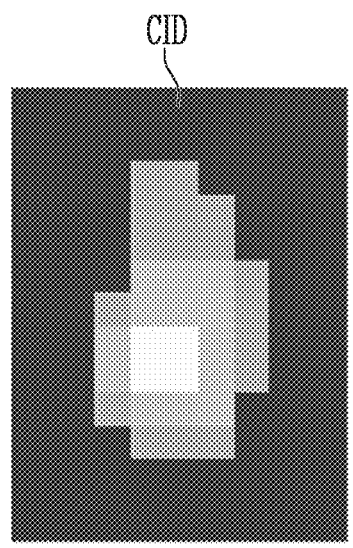
Figure 13A:
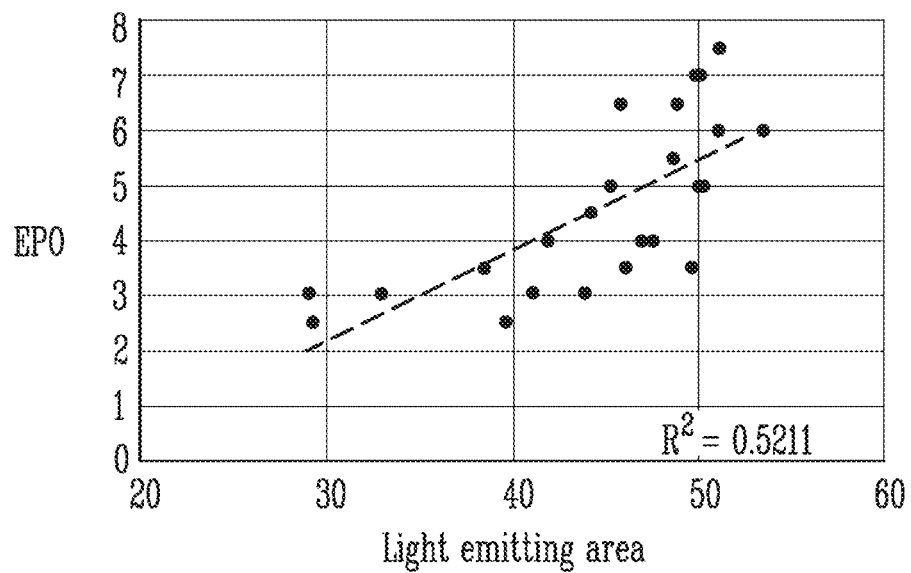
FIG. 13A, FIG. 13B, and FIG. 13C illustrate graphs of a relationship between a light emitting area and the number of light emitting elements.
Figure 13B:
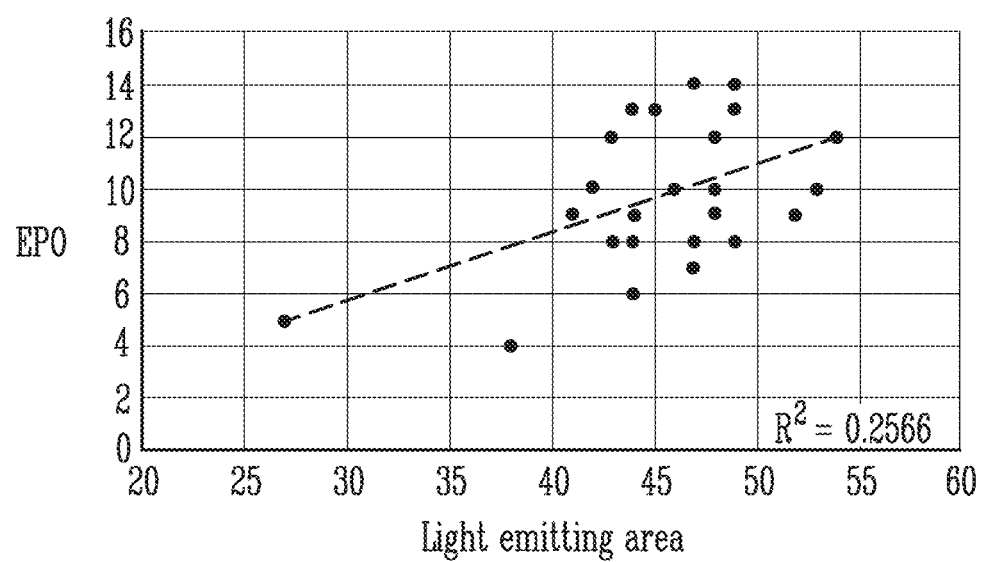
Figure 13C:
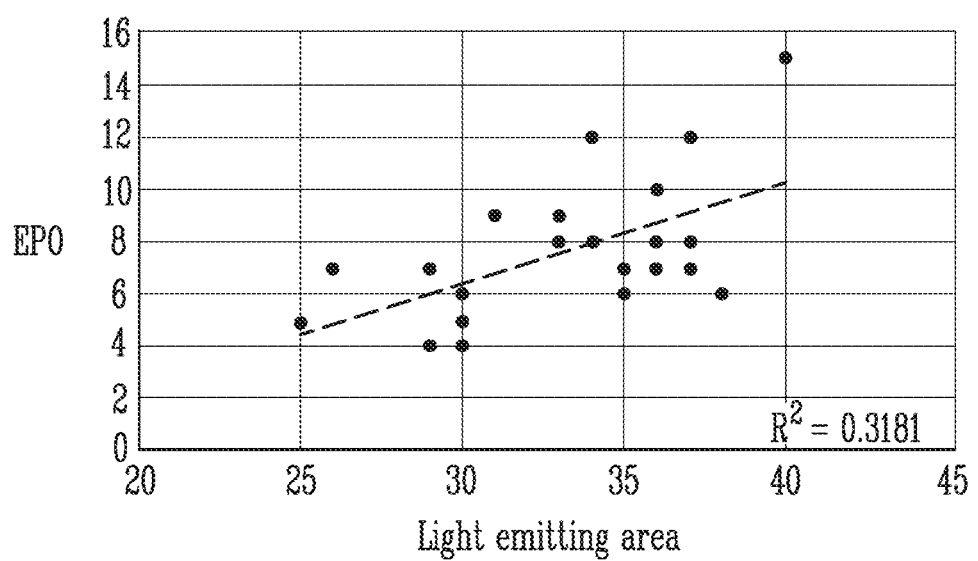

FIG. 9 illustrates an embodiment of an after-image compensator included in the display device of FIG. 1. FIG. 9 briefly illustrates the after-image compensator 200 (see FIG. 1) centering on a function of generating characteristic data PCD for each pixel, and for better understanding and ease of description, it further illustrates an image capturer 20 and a memory 500. FIG. 10 illustrates a state of capturing a display panel 100 according to an embodiment. FIG. 11, FIG. 12A, and FIG. 12B illustrate images for explaining an operation of a pixel data generator of FIG. 9. FIG. 13A, FIG. 13B, and FIG. 13C illustrate graphs of a relationship between a light emitting area and the number of light emitting elements.

First, referring to FIG. 1, FIG. 9, and FIG. 10, the image capturer 20 may generate a captured image CI by capturing the display panel 100. For example, before shipment of a product in a manufacturing process of a display device, the image capturer 20 captures an image displayed on the display panel 100 to generate the captured image CI, and may provide the captured image CI to a pixel data generator 210. The captured image CI may include information on the number of light emitting elements for each pixel PX or information corresponding thereto. Here, the image capturer 20 may be implemented as an external thermal image camera, a charge-coupled device (CCD) camera, or the like.

The pixel data generator 210 may generate the characteristic data PCD for each pixel based on the captured image CI. The characteristic data PCD for each pixel (or the characteristic data for each element group) may include the number of light emitting elements in a corresponding pixel (or a corresponding element group) and/or information corresponding thereto. The characteristic data PCD for each pixel may be stored in the memory 500.

In one or more embodiments, the pixel data generator 210 may generate captured image data CID (see FIG. 12B) by processing the captured image CI. In this case, the pixel data generator 210 may generate the characteristic data PCD for each pixel based on the captured image data CID.

For reference, during the manufacturing process of the display device, as a process of measuring luminance of the display device and a process of adjusting a voltage applied to the display device (or a process of adjusting an offset or compensation value for emission characteristics of each of the pixels) are repeated several times, luminance deviation may be compensated. The process of compensating for the luminance deviation may be referred to as optical compensation, and in the embodiment, the characteristic data PCD for each pixel generated by the pixel data generator 210 may be data on which the optical compensation is performed.

Referring to FIG. 11, a top plan view of a portion of the display panel 100 (see FIG. 1) corresponding to first, second, and third pixels PX1, PX2, and PX3 is shown. The components shown in FIG. 11 have been described with reference to FIG. 3 and FIG. 4, so related descriptions are omitted. As shown in FIG. 11, the number of light emitting elements LD is different for each pixel, and the number of light emitting elements LD for each element group SET in one pixel may be different.

Referring to FIG. 12A and FIG. 12B, FIG. 12A shows a captured image CI obtained by capturing a portion corresponding to one element group SET of FIG. 11 through the image capturer 20, and FIG. 12B shows a captured image data CID generated by processing the captured image of FIG. 12A.

The pixel data generator 210 may process the captured image CI of FIG. 12A to generate the captured image data CID shown in FIG. 12A. The captured image data CID shown in FIG. 12B may be processed to be clearer than the captured image CI of FIG. 12A, and in this case, a light emitting area of the element group SET (and the pixel) may be easily grasped.

The pixel data generator 210 may determine the light emitting area of one pixel from the captured image data CID shown in FIG. 12B, and may calculate the number of light emitting elements by applying a luminance weight to the light emitting area.

In one or more embodiments, the pixel data generator 210 may apply the luminance weight value to the captured image data CID with reference to Equation 1, Equation 2, and Table 1 below.

$$BR = \text{if (luminance value for each portion according to CID position} > TH) = 1, \text{ else } 0 \quad \text{Equation 1}$$

Here, BR is a constant for calculating the light emitting area from the CID, and TH is a minimum threshold value for applying a luminance value for each portion according to a preset position.

$$\sum_{k=0}^{m \times n} WF_k \times BR_k \quad \text{Equation 2}$$

Here, (m×n) is the number of pixels of a capturing camera corresponding to an area or an element group (or a pixel) being captured, WF is a luminance weight value, and BR is a value of Equation 1.

TABLE 1

| CID portion | Luminance value for each CID portion | Luminance weight value (WF) |
|---|---|---|
| First portion | <TH1 | 0.5 |
| Second portion | >TH1 & <TH2 | 1 |
| Third portion | >TH2 & <TH3 | 1.5 |
| Fourth portion | >TH3 | 2 |

Referring to Equation 1, when a luminance value for each portion according to a position of the captured image data CID is greater than a preset threshold value TH, the constant BR may have a value of 1, and when the luminance value for each portion according to the position of the captured image data CID is smaller than the preset threshold value TH, the constant BR may have a value of 0. '1' means that the luminance value of the corresponding portion is reflected in the light emitting area, and '0' means that the luminance value of the corresponding portion is not reflected in the light emitting area. Accordingly, the pixel data generator 210 may determine the light emitting area of one element group (or pixel) by reflecting (e.g., applying) a portion of the captured image data CID that exceeds a minimum threshold value. Then, referring to Equation 1, Equation 2, and Table 1 together, a final light emitting area of the corresponding element group is calculated by summing the value obtained by multiplying a luminance weight WF according to the portion of the captured image data CID by the constant BR. Accordingly, the pixel data generator 210 may calculate the light emitting area of one element group. For example, when the luminance value of the first portion is smaller than a first threshold value TH1, the luminance weight value WF of 0.5 may be applied, and the luminance value of the second portion is greater than a first threshold value TH1 and smaller than a second threshold value TH2, the luminance weight value WF of 1 may be applied. In addition, when the luminance value of the third portion is greater than the second threshold value TH2 and smaller than a third threshold value TH3, the luminance weight value WF of 1.5 may be applied, and when the luminance value of the fourth portion is greater than the third threshold value TH3, the luminance weight value WF of 2 may be applied. Here, as the luminance weight value WF increases, the corresponding portion may be inferred as a brighter portion than other portions.

In one or more embodiments, the pixel data generator 210 may calculate the number of light emitting elements based on the light emitting area.

Referring to FIG. 13A to FIG. 13C, it is possible to determine a relationship of the number of light emitting elements according to the light emitting area of each element group. Here, EPO corresponds to the number of light emitting elements in the element group, and the light emitting area may be a value to which the luminance weight value according to the position of the captured image data CID described with reference to FIG. 12B is applied. The light emitting area and the EPO may have a linear relationship, for example, a proportional relationship. For example, as the light emitting area increases, the EPO may increase. As the EPO increases, the current density may decrease.

In one or more embodiments, the relationship between the light emitting area and the EPO may vary depending on a color of light emitted from the light emitting element or the pixel. Accordingly, the EPO, that is, the number of light emitting elements may be calculated in consideration of the color.

As an example, FIG. 13A shows the EPO according to the light emitting area in a first pixel (for example, a green pixel), FIG. 13B shows the EPO according to the light emitting area in a second pixel (for example, a red pixel), and FIG. 13C shows the EPO according to the light emitting area in a third pixel (for example, a blue pixel). $R^2$ shown in FIG. 13A to FIG. 13C is a proportional constant of the EPO according to the light emitting area, and is not limited to the illustrated number, and may be variously changed according to one or more embodiments.

That is, a linear equation related to the light emitting area and the EPO may be preset, and the EPO, that is, the number of light emitting elements, may be calculated based on the linear equation and the light emitting area.

As described above, the pixel data generator 210 may calculate the light emitting area based on the captured image data CID (or the captured image CI) of the element group (or one pixel), and may obtain the number of light emitting elements or information corresponding thereto from the light emitting area by using the graphs (or equations derived therefrom) shown in FIG. 13A to FIG. 13C.

Figure 14:
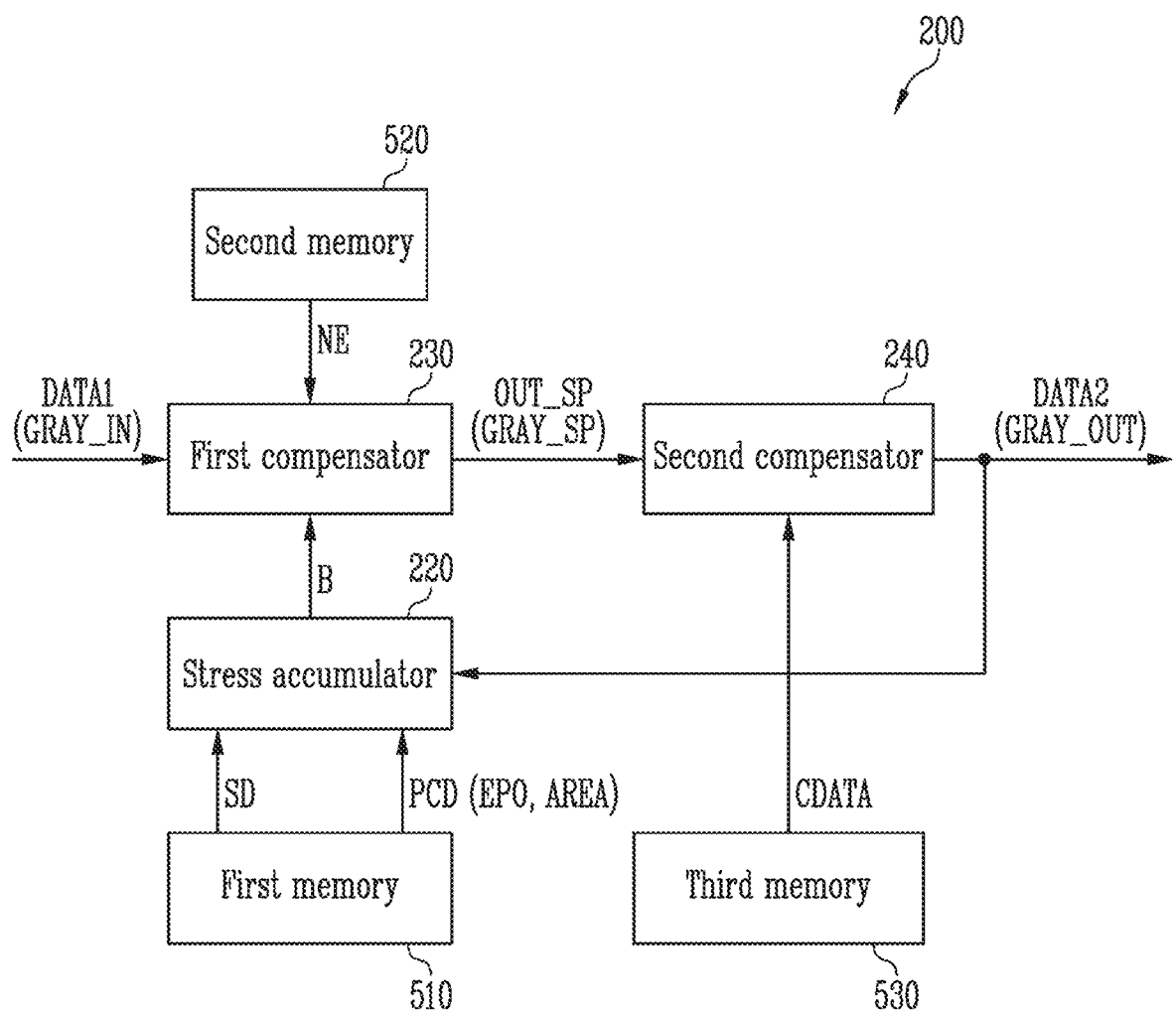
FIG. 14 illustrates an embodiment of an after-image compensator included in the display device of FIG. 1.

FIG. 14 illustrates an embodiment of an after-image compensator included in the display device of FIG. 1. In FIG. 14, the after-image compensator 200 (see FIG. 1) is briefly shown focusing on the function of performing after-image compensation. For better understanding and ease of description, a first memory 510, a second memory 520, and a third memory 530 are further shown, and the first memory 510, the second memory 520, and the third memory 530 may be included in the memory 500 of FIG. 1.

Referring to FIG. 1, FIG. 9, and FIG. 14, the after-image compensator 200 may perform an after-image compensation operation based on the characteristic data PCD for each pixel (or the degradation distribution information for each pixel).

The after-image compensator 200 may include a stress accumulator 220, a first compensator 230 (or a degradation compensator), and a second compensator 240 (or a Mura compensator).

In one or more embodiments, however, the stress accumulator 220 may generate or update a degradation rate of the pixel B based on the second data DATA2 and the stress data SD. In one or more embodiments, the stress accumulator 220 may generate or update stress data SD based on second data DATA2. The stress data SD may be stored in the first memory 510. In one or more embodiments, the stress accumulator 220 may calculate a current density for each element group based on the characteristic data PCD for each pixel, and may calculate a degradation rate (or degraded luminance) of a pixel based on the current density.

In one or more embodiments, the stress accumulator 220 may calculate the current density based on Equation 3 and Equation 4 below.

$$I=f(\text{OUT\_SP (GRAY\_IN)}+\text{MCA(GRAY\_IN)}) \quad \text{Equation 3}$$

Here, I is a driving current flowing through the element group (or the pixel), f is a function that converts a grayscale into a current value, OUT_SP is a function that defines an operation of the first compensator 230, and MCA is a function that defines an operation of the second compensator 240.

An input grayscale (e.g., an input gray level) GRAY_IN may be included in a first data DATA1. "OUT_SP(G-RAY_IN)" defines an operation of the first compensator 230 only with the input grayscale GRAY_IN, so that a value corresponding to a compensated grayscale (e.g., a compensated gray level) GRAY_SP (that is, a compensated grayscale GRAY_SP of an output data OUT_SP) for the input grayscale GRAY_IN may be approximately calculated through "OUT_SP(GRAY_IN)". Similarly, "MCA (GRAY_IN)" defines an operation of the second compensator 240 only with the input grayscale GRAY_IN, so that a value corresponding to a compensation value (that is, a compensation compensated data CDATA) for the input grayscale GRAY_IN may be approximately calculated through "MCA(GRAY_IN)". Because a sum of the compensated grayscale GRAY_SP and the compensation value corresponds to an output grayscale (e.g., an output gray level) GRAY_OUT of the second data DATA2, a driving current value corresponding to the output grayscale GRAY_OUT of the second data DATA2 may be approximately calculated through Equation 3.

$$J_i = \left(\frac{I}{EPO_i \times AREA}\right), i = 1 \sim n \qquad \text{Equation 4}$$

Here, $J_i$ is a current density of an i-th element group (or light emitting element), I is a value of Equation 3, $EPO_i$ is the number of light emitting elements in an i-th element group, and AREA is an area of the element group.

Information about the number of light emitting elements, that is, the EPO and information about the area of the element group, that is, the AREA may be included in the characteristic data PCD for each pixel, and may be pre-stored in the first memory 510.

For reference, when the EPO is expressed as a number per unit area, the EPO and the AREA are multiplied, but because the area of the element group is the same or uniform throughout the display panel, the AREA is 1, or the multiplication operation of the AREA for the EPO may be omitted.

Referring to Equation 3 and Equation 4, the stress accumulator 220 may predict the driving current (or current amount) based on the input grayscale GRAY_IN. This is because it is difficult to directly or in real time sense the driving current flowing through the element group (or pixel). In addition, the stress accumulator 220 may predict or calculate the current density by dividing the driving current by the number of light emitting elements included in the element group, that is, the EPO. Referring to FIG. 6, for example, the stress accumulator 220 may calculate the first current density of the first element group SET1 based on the first information regarding the number of the first light emitting elements LD1. Similarly, it may calculate the second current density of the second element group SET2 based on the second information regarding the number of the second light emitting elements LD2, may calculate the third current density of the third element group SET3 based on the third information regarding the number of the third light emitting elements LD3, and may calculate the fourth current density of the fourth element group SET4 based on the fourth information regarding the number of the fourth light emitting elements LD4.

In one or more embodiments, the stress accumulator 220 may calculate the degradation rate of the pixel based on Equation 5.

$$B_i = \exp\left[-\frac{(t_0 + \Delta t)}{\tau_{Ji}}\right]^{\beta_{Ji}} \qquad \text{Equation 5}$$

$$B = \frac{\sum_{i=1}^{n} B_i}{n}$$

Here, $B_i$ is a degradation rate (or degraded luminance) of an i-th element group, $t_0$ is a constant representing a reference time, $\Delta t$ is an amount of time change, $\beta_{Ji}$, and $\tau_{ji}$ are variables according to $J_i$ of Equation 4, and B is a degradation rate of the pixel.

A reference time to refers $t_0$ an accumulated use time and is included in the stress data SD, and a time change amount $\Delta t$ may refer to a time driven by (or at) a corresponding current density, but is not limited thereto.

Referring to Equation 5, the degradation rate $B_i$ of the i-th element group is expressed as an exponential function, and may be expressed by reflecting (e.g., applying) the current density $J_i$ of the i-th element group.

The stress accumulator 220 may calculate the degradation rate $B_i$ of the element group based on the current density $J_i$ of the element group, and may calculate the degradation rate B of the pixel by averaging the degradation rates $B_i$ of the element groups. Referring to FIG. 6, for example, the stress accumulator 220 may calculate the first degradation rate of the first element group SET1 based on the first current density of the first element group SET1, may calculate the second degradation rate of the second element group SET2 based on the second current density of the second element group SET2, may calculate the third degradation rate of the third element group SET3 based on the third current density of the third element group SET3, may calculate the fourth degradation rate of the fourth element group SET4 based on the fourth current density of the fourth element group SET4, and may calculate the degradation rate B of the pixel by averaging the first to fourth degradation rates. However, the present disclosure is not limited thereto. For example, the stress accumulator 220 may calculate the degradation rate B of the pixel by weighted average of the degradation rates $B_i$ of the element group.

The first compensator 230 may generate the output data OUT_SP by compensating the first data DATA1 based on the degradation rate B of the pixel. For example, the first compensator 230 may generate a compensated grayscale GRAY_SP by compensating the input grayscale GARY_IN based on Equation 6 below.

$$(G')^\gamma \cdot B = G^\gamma \qquad \text{Equation 6}$$

$$G' = G \cdot \left(\frac{1}{B}\right)^{\frac{1}{\gamma}}$$

Here, G' is a compensated grayscale, G is an input grayscale, B is a value of Equation 5, and $\gamma$ is a gamma value.

Referring to Equation 6, the first compensator 230 may calculate the compensated grayscale GRAY_SP based on the input grayscale GRAY_IN and the degradation rate B. The first compensator 230 may calculate the compensated grayscale GRAY_SP that is positioned on a gamma curve of a specific gamma value (for example, 2.2) and is equal to the input grayscale GRAY_IN by applying the degradation rate B. That is, the value to which the degradation rate B is applied to the compensated grayscale GRAY_SP may be the same as the input grayscale GRAY_IN.

In one or more embodiments, the first compensator 230 may generate the output data OUT_SP by compensating the first data DATA1 based on the pixel degradation rate B and the pixel light emitting efficiency NE.

Referring to FIG. 7, for example, the current density may vary depending on the grayscale, and the light emitting efficiency may vary depending on the current density. In addition, when the after-image compensation is performed, the driving current flowing through the pixel (or element group) and the corresponding current density may additionally vary, and the light emitting efficiency may additionally vary. Accordingly, the first compensator 230 may perform the compensation operation based on the light emitting efficiency NE of the pixel. Through this, more accurate after-image compensation may be realized.

In one or more embodiments, the first compensator 230 may compensate the input grayscale GRAY_IN based on Equation 7.

$$J_T = \left(\frac{1}{EPO_{TARGET} \times \text{AREA}}\right) \quad \text{Equation 7}$$

$$NE_J = \frac{\sum_{i=1}^{n} NE_{Ji}}{n}$$

$$G' = G \cdot \left(\frac{1}{B \times \frac{NE_{J'}}{NE_J} \times \frac{NE_{JT}}{NE_{JT'}}}\right)^{\frac{1}{\gamma}}, J' = \frac{J}{B}, J_{T'} = \frac{J_T}{B}$$

Here, $J_T$ is a current density for each grayscale of an element group or a reference pixel for which the EPO is set as a reference (e.g., target) value, I is a value of Equation 3, $EPO_{TARGET}$ is a reference value, $NE_J$ is light emitting efficiency of a pixel, NEji is light emitting efficiency of an i-th element group, G' is a compensated grayscale, G is an input grayscale, B is a value of Equation 5, and $\gamma$ is a gamma value.

Referring to FIG. 2, for example, the reference pixel PX_REF may include the light emitting part EMU in which only the number of light emitting elements LD corresponding to the reference value are connected in parallel, but is not limited thereto. The light emitting efficiency NE, particularly, the light emitting efficiency NE according to the current density is as described with reference to FIG. 7, and information on the light emitting efficiency NE may be stored in the second memory 520. For example, the light emitting efficiency NE according to the current density may be pre-stored in a form of a lookup table. For example, the light emitting efficiency NE according to the current density for the reference pixel may be pre-stored in a form of a lookup table.

Referring to Equation 6 and Equation 7, the first compensator 230 compensates the input grayscale GRAY_IN by reflecting (e.g., applying) the pixel degradation rate B, and it may compensate the input grayscale GRAY_IN by reflecting (e.g., applying) a change (that is, $NE_{JT}/NE_{JT}$) in the luminous efficiency NE according to the grayscale and a change (that is, $NE_J/NE_J$) in the light emitting efficiency NE due to the degradation of the corresponding pixel. Because it is difficult to store all data representing the change in the light emitting efficiency NE according to the grayscale for each pixel, the first compensator 230 may determine the change in the light emitting efficiency NE according to the grayscale based on the reference pixel, and may additionally reflect the change in the light emitting efficiency NE due to the degradation of the corresponding pixel. The light emitting efficiency NE of the corresponding pixel may be calculated by averaging the light emitting efficiencies of the element groups within the corresponding pixel. Referring to FIG. 6, for example, the first light emitting efficiency of the first element group SET1, the second light emitting efficiency of the second element group SET2, the third element efficiency of the third element group SET3, and the fourth light emitting efficiency of the fourth element group SET4 may be respectively calculated, and the light emitting efficiency of the pixel may be calculated by averaging the first to fourth light emitting efficiencies.

The second compensator 240 may generate the second data DATA2 by compensating the output data OUT_SP of the first compensator 230 based on the compensation data CDATA. The compensation data CDATA may be preset to compensate for luminance deviation between the pixels in an optical compensation process for the display device, and may include an offset value (or correction value) corresponding to each pixel. The compensation data CDATA may be stored in the third memory 530. For example, the second compensator 240 may calculate the output grayscale GRAY_ OUT by summing the compensated grayscale GRAY_SP and the offset value of the corresponding pixel.

As described above, the after-image compensator 200 may calculate the current density for each element group in the pixel, and may calculate the degradation rate B of the pixel based on the current density. In addition, the after-image compensator 200 may compensate for the input grayscale GRAY_IN (or the first data DATA1) by additionally applying the light emitting efficiency NE of the pixel in addition to the degradation rate B of the pixel. Accordingly, more accurate after-image compensation may be performed.

In one or more embodiments, in FIG. 14, the operation of the after-image compensator 200 has been described when the pixel includes a plurality of element groups, but it is not limited to the after-image compensator 200. The after-image compensator 200 described with reference to FIG. 14 may also be applied to a display device including a pixel (that is, the pixel PX in FIG. 2) including only one element group.

Figure 15:
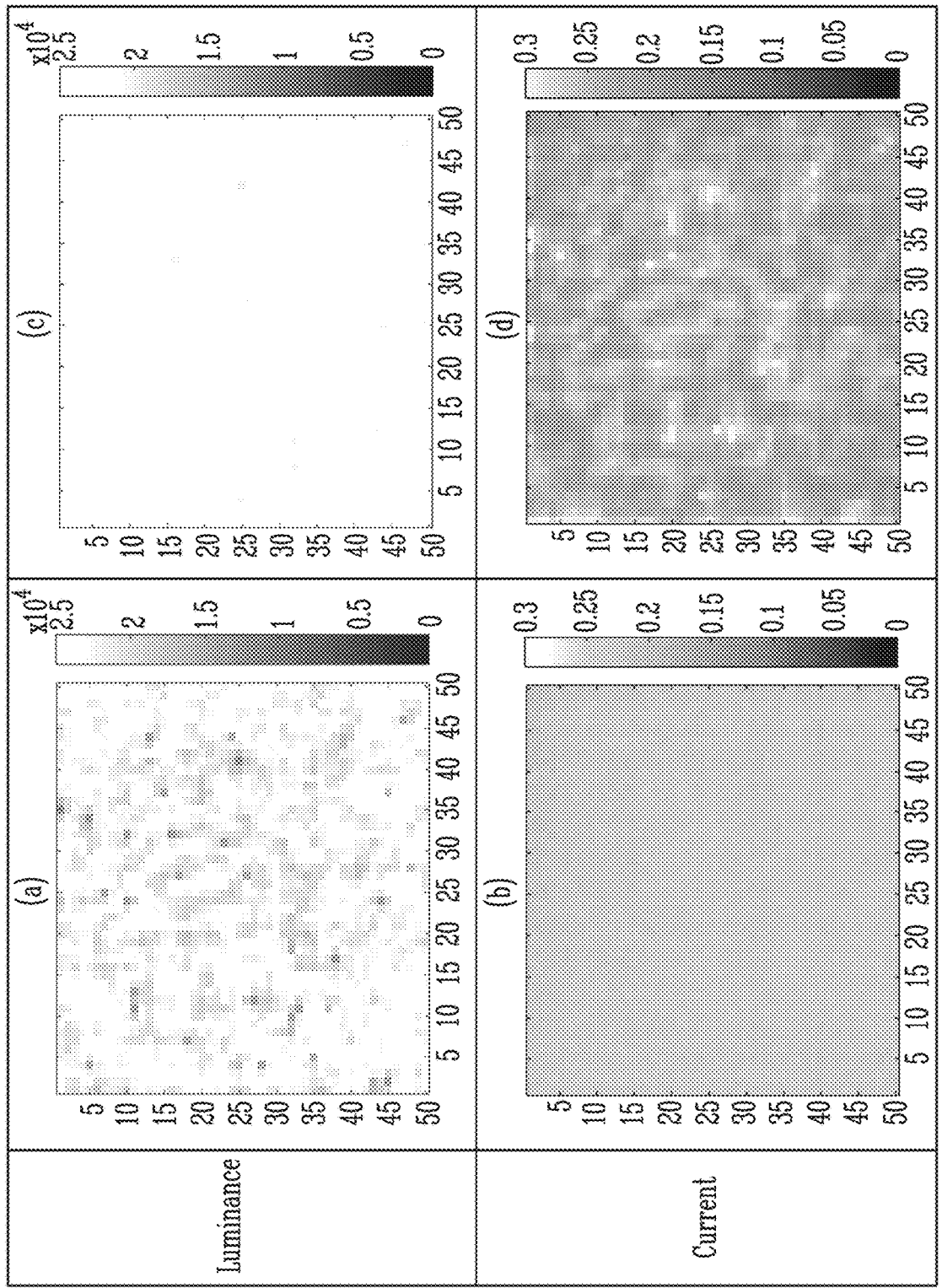
FIG. 15 illustrates images of a state of a display panel before and after the after-image compensator of FIG. 14 is driven.
Figure 16:
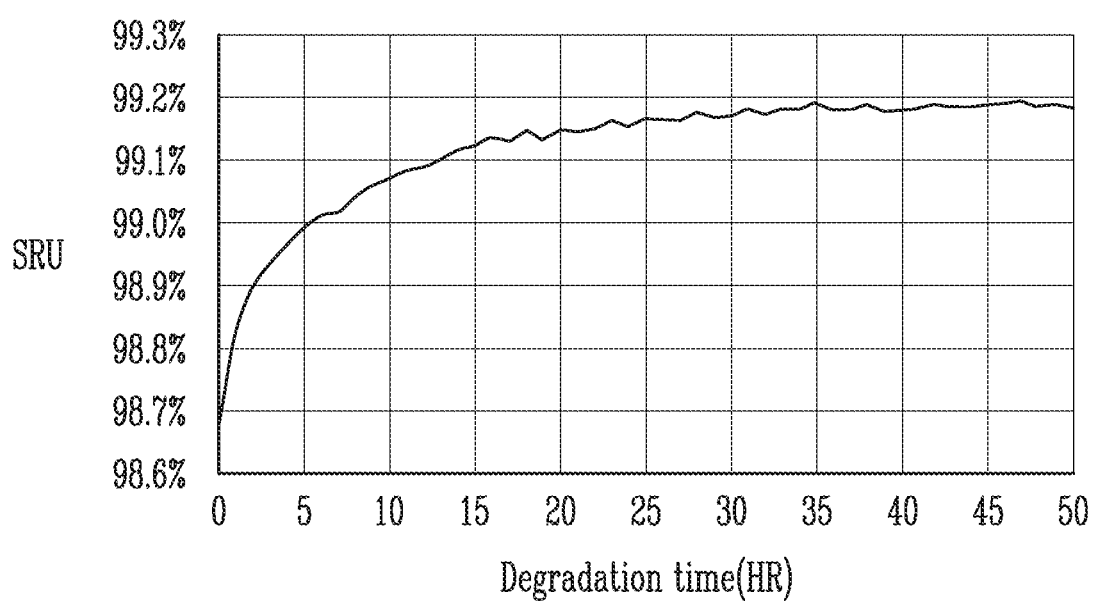
FIG. 16 illustrates a graph of short range uniformity of a display panel according to a degradation time.

FIG. 15 illustrates images of a state of a display panel before and after the after-image compensator of FIG. 14 is driven. FIG. 16 illustrates a graph of short range uniformity of a display panel according to a degradation time.

Referring to FIG. 1, FIG. 14, and FIG. 15, FIG. 15 (a) and (b) show luminance and current distribution images of the display panel 100 before the after-image compensator 200 is driven. FIG. 15 (c) and (d) show luminance and current distribution images of the display panel 100 after the after-image compensator 200 is driven.

When performing after-image compensation by driving the after-image compensator 200, the luminance of the display panel may be uniformly changed. Referring to FIG. 15 (a) and (c), it can be seen that the luminance of the display panel is non-uniform in (a) and the luminance of the display panel is uniformly improved in (c).

On the other hand, when the after-image compensator 200 is driven, and when each pixel of the display panel is degraded, a stress current deviation may occur. FIG. 15 (b) shows images before degradation of each pixel, and FIG. 15 (d) shows images after degradation of each pixel. As time elapses, a short range uniformity of the display panel 100 may decrease due to the stress current deviation. Here, the short range uniformity may indicate a degree to which the luminance appears uniformly on the display panel 100, in particular, the luminance uniformity between neighboring pixels.

Accordingly, the after-image compensator 200 may calculate the current density for each element group (and for each pixel) to more accurately calculate the degradation rate B of the pixel, and may also more accurately perform the after-image compensation for each pixel and each grayscale by additionally applying the light emitting efficiency NE of the pixel in addition to the degradation rate B of the pixel.

Accordingly, as shown in FIG. 16, even if time (or degradation time) elapses, the short range uniformity SRU of the display panel 100 does not decrease, and for example, despite the elapse of time (or degradation time), the short range uniformity (SRU) of the display panel 100 may be maintained at 99% or more. That is, degradation of the display quality of the display panel 100 may be prevented.

Figure 17:
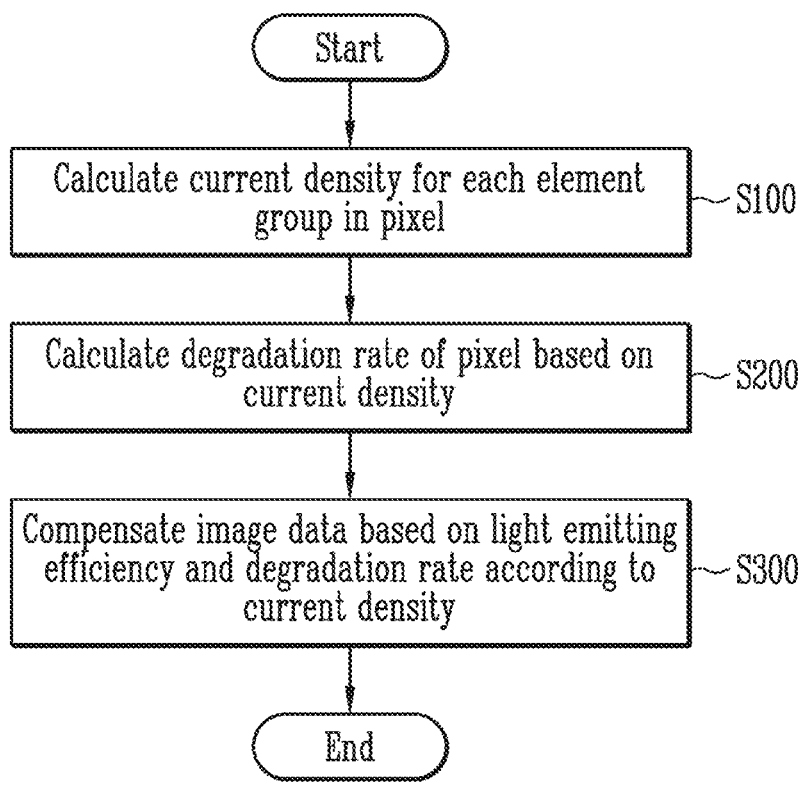
FIG. 17 illustrates a flowchart of an image data compensating method of a display device according to one or more embodiments.

FIG. 17 illustrates a flowchart of an image data compensating method of a display device according to one or more embodiments.

Referring to FIG. 1 to FIG. 17, the display device 10 (or the after-image compensator 200) may calculate the current density for each element group in the pixel PX (S100).

For example, the display device 10 may obtain or read the characteristic data PCD for each pixel from the memory 500. Subsequently, as described with reference to Equation 3 and Equation 4, the display device 10 predicts the driving current based on the input grayscale GRAY_IN, and may calculate the current density for each element group of the pixel based on information on the number of light emitting elements for each element group of the pixel included in the preset characteristic data PCD for each pixel, that is, the EPO.

Then, the display device 10 may calculate the degradation rate B (or degraded luminance) of the pixel based on the current density for each element group (S200).

As described with reference to Equation 5, the display device 10 may calculate the degradation rate of the element group based on the current density of the element group in the pixel, and may calculate the degradation rate B of the pixel based on the degradation rate of the element group (for example, by averaging the degradation rate of the element group).

Then, the display device 10 may perform after-image compensation for image data (or the first data DATA1) based on the degradation rate B of the pixel. For example, as described with reference to Equation 6, the display device 10 may calculate the output grayscale GRAY_OUT for the input grayscale GRAY_IN based on the degradation rate B of the pixel.

In one or more embodiments, the display device 10 may compensate image data based on the degradation rate B of the pixel and the current density of each element group (S300).

As described with reference to Equation 7, the display device 10 compensates for the input grayscale GRAY_IN of the image data by reflecting (e.g., applying) the pixel degradation rate B, and in this case, it may compensate for the input grayscale GRAY_IN by reflecting (e.g., applying) the change in the light emitting efficiency NE due to the degradation of the corresponding pixel (that is, $NE_{J'}/NE_J$) and the change (that is, $NE_{JT'}/NE_{JT'}$) in the light emitting efficiency according to the grayscale.

Thereafter, the display device 10 may generate a data signal based on the compensated image data, that is, the second data DATA2, and may provide the data signal to the display panel 100.

As described above, the display device 10 may calculate the current density for each element group in the pixel, may calculate the degradation rate B of the pixel based on the current density, and may compensate the image data by additionally applying the light emitting efficiency NE of the pixel in addition to the degradation rate B of the pixel. Accordingly, more accurate after-image compensation for the image data may be performed, and as described with reference to FIG. 16, despite the elapse of time (or degradation time), the short range uniformity (SRU) of the display panel 100 may be maintained constant, and degradation of display quality may be prevented.

Figure 18:
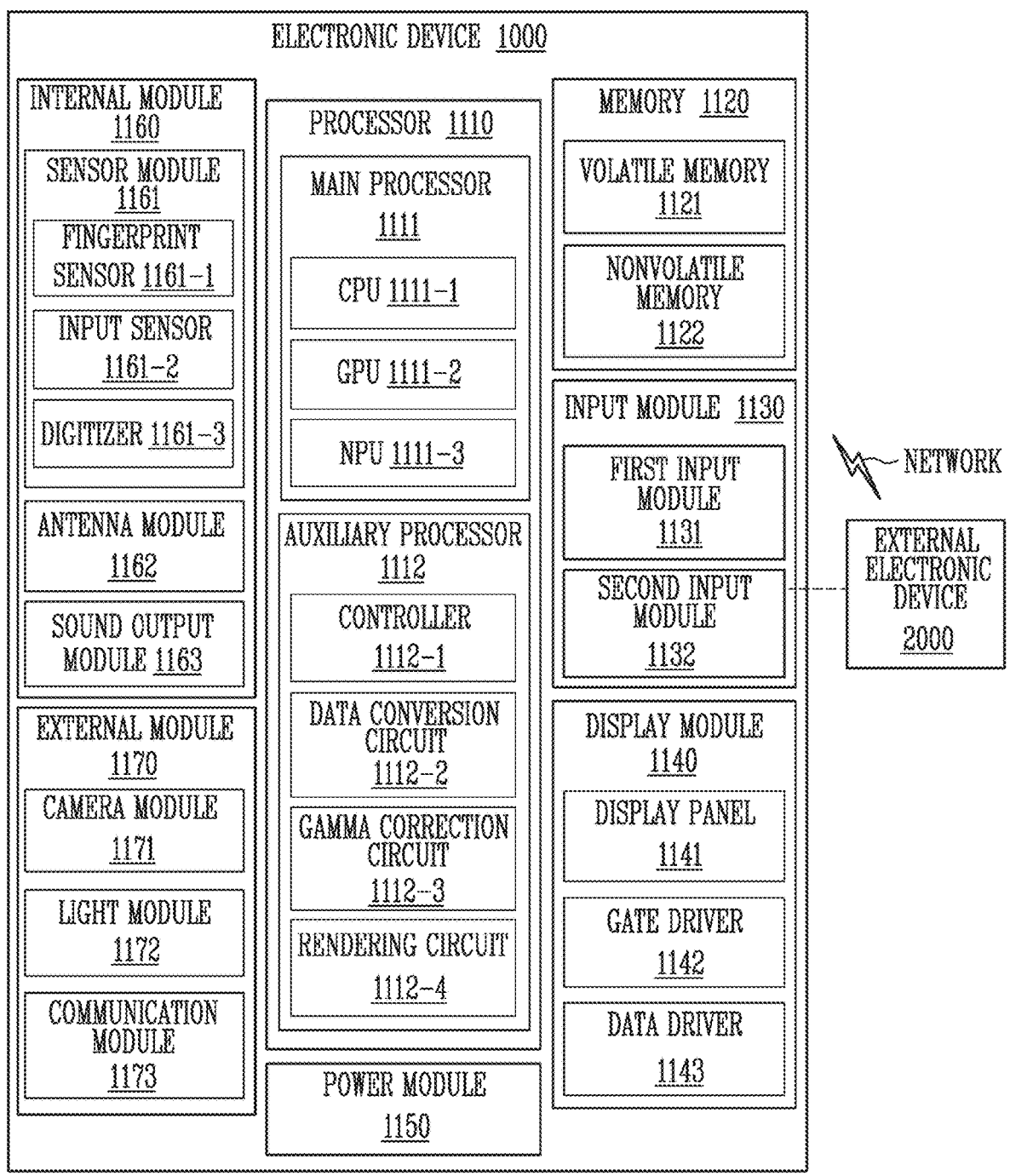
FIG. 18 illustrates an electronic device to which a display device according to one or more embodiments of the present disclosure is applied.

FIG. 18 illustrates an electronic device to which a display device according to one or more embodiments of the present disclosure is applied.

An electronic device 1000 outputs various information through a display module 1140 within an operating system. The display module 1140 may correspond to at least some of the display device 10 of FIG. 1. When a processor 1110 executes an application stored in a memory 1120, the display module 1140 provides application information to a user through a display panel 1141. The display panel 1141 may correspond to the display panel 100 of FIG. 1.

The processor 1110 obtains external input through an input module 1130 or a sensor module 1161 and executes an application corresponding to the external input. For example, when the user selects a camera icon displayed on the display panel 1141, the processor 1110 obtains user input through an input sensor 1161-2 and activates the camera module 1171. The processor 1110 transmits image data corresponding to a captured image obtained through the camera module 1171 to the display module 1140. The display module 1140 may display an image corresponding to the captured image through the display panel 1141.

As another example, when personal information authentication is executed in the display module 1140, a fingerprint sensor 1161-1 obtains inputted fingerprint information as input data. The processor 1110 compares the inputted data obtained through the fingerprint sensor 1161-1 with authentication data stored in the memory 1120, and executes an application according to the compared result. The display module 1140 may display information executed according to application logic through the display panel 1141.

As another example, when a music streaming icon displayed on the display module 1140 is selected, the processor 1110 obtains user input through the input sensor 1161-2 and activates a music streaming application stored in the memory 1120. When a music execution instruction is inputted from the music streaming application, the processor 1110 activates a sound output module 1163 to provide sound information corresponding to the music execution instruction to the user.

In the above, the operation of the electronic device 1000 has been briefly described. Hereinafter, a configuration of the electronic device 1000 will be described in detail. Some of components of the electronic device 1000 to be described later may be integrated and provided as one component, and one component thereof may be divided and provided as two or more components.

Referring to FIG. 18, the electronic device 1000 may communicate with an external electronic device 2000 through a network (for example, a short range wireless communication network or a long range wireless communication network). According to one or more embodiments, the electronic device 1000 may include the processor 1110, the memory 1120, the input module 1130, the display module 1140, a power module 1150, an internal module 1160, and an external module 1170. According to one or more embodiments, in the electronic device 1000, at least one of the aforementioned constituent elements may be omitted, or one or more other constituent elements may be added. According to one or more embodiments, some (for example, the sensor module 1161, an antenna module 1162, or a sound output module 1163) of the aforementioned constituent elements may be integrated into another constituent element (for example, the display module 1140).

The processor 1110 may execute software to control at least one other constituent element (for example, a hardware or software constituent element) of the electronic device 1000 connected to the processor 1110, and may perform various data processing or operations. According to one or more embodiments, as at least some of the data processing or operation, the processor 1110 may store an instruction or data received from other constituent element (for example, the input module 1130, the sensor module 1161, or a communication module 1173) in a volatile memory 1121, may process the instructions or data stored in the volatile memory 1121, and may store the result data in a non-volatile memory 1122.

The processor 1110 may include a main processor 1111 and an auxiliary processor 1112.

The main processor 1111 may include one or more of a central processing unit (CPU) 1111-1 and an application processor (AP). The main processor 1111 may further include one or more of a graphic processing unit (GPU) 1111-2, a communication processor (CP), and an image signal processor (ISP). The main processor 1111 may further include a neural processing unit (NPU) 1111-3. The neural processing unit is a processor specialized in processing an artificial intelligence model, and the artificial intelligence model may be generated through machine learning. The artificial intelligence model may include a plurality of artificial neural network layers. The artificial neural network may be one of a deep neural network (DNN), a convolutional neural network (CNN), a recurrent neural network (RNN), a restricted boltzmann machine (RBM), a deep belief network (DBN), a bidirectional recurrent deep neural network (BRDNN), a deep Q-network, and a combination of two or more thereof, but is not limited to the above example. The artificial intelligence models may additionally or alternatively include a software structure in addition to the hardware structure thereof. At least two of the aforementioned processing units and processors may be implemented as an integrated component (for example, a single chip), or each thereof may be implemented as an independent component (for example, a plurality of chips).

In one or more embodiments, the main processor 1111 may include at least some components of the after-image compensator 200 of FIG. 1. For example, the main processor 1111 may output compensated image data based on the characteristic data for each pixel (or the characteristic data for each element group in the pixel) and the accumulated stress data for each pixel.

The auxiliary processor 1112 may include a controller 1112-1. The controller 1112-1 may include an interface conversion circuit and a timing control circuit. The controller 1112-1 receives an image signal from the main processor 1111, and converts a data format of the image signal to meet an interface specification with the display module 1140 to output image data. The controller 1112-1 may output various control signals necessary for driving the display module 1140.

The auxiliary processor 1112 may further include a data conversion circuit 1112-2, a gamma correction circuit 1112-3, a rendering circuit 1112-4, and the like. The data conversion circuit 1112-2 may receive image data from the controller 1112-1, and it may compensate the image data to display the image with a desired luminance according to characteristics of the electronic device 1000 or a user's setting, or convert the image data to reduce power consumption or compensate for an after-image. The gamma correction circuit 1112-3 may convert the image data or gamma reference voltage so that the image displayed on the electronic device 1000 has a desired gamma characteristic. The rendering circuit 1112-4 may receive image data from the controller 1112-1, and render the image data in consideration of pixel disposition of the display panel 1141 applied to the electronic device 1000. At least one of the data conversion circuit 1112-2, the gamma correction circuit 1112-3, and the rendering circuit 1112-4 may be incorporated into another constituent element (for example, the main processor 1111 or the controller (1112-1)). At least one of the data conversion circuit 1112-2, the gamma correction circuit 1112-3, and the rendering circuit 1112-4 may be integrated into a data driver 1143 to be described later.

In one or more embodiments, the auxiliary processor 1112 may include at least some components of the after-image compensator 200 of FIG. 1. For example, the after-image compensator 200 of FIG. 1 may be included in the auxiliary processor 1112 instead of the main processor 1111. For example, the auxiliary processor 1112 (or the controller 1112-1) may output compensated image data based on the characteristic data for each pixel (or the characteristic data for each element group in the pixel) and the accumulated stress data for each pixel.

The memory 1120 may store various data used by at least one constituent element (for example, the processor 1110 or the sensor module 1161) of the electronic device 1000, and input data or output data for an instruction related thereto. The memory 1120 may include at least one or more of the volatile memory 1121 and the non-volatile memory 1122.

The input module 1130 may receive an instruction or data to be used for a constituent element (for example, the processor 1110, the sensor module 1161, or the sound output module 1163) of the electronic device 1000 from the outside of the electronic device 1000 (for example, a user or the external electronic device 2000).

The input module 1130 may include a first input module 1131 to which an instruction or data is inputted from a user and a second input module 1132 to which an instruction or data is inputted from the external electronic device 2000. The first input module 1131 may include a microphone, a mouse, a keyboard, a key (for example, a button), or a pen (for example, a passive pen or active pen). The second input module 1132 may support a designated protocol that may be connected to the external electronic device 2000 by wire or wirelessly. According to one or more embodiments, the second input module 1132 may include a high definition multimedia interface (HDMI), a universal serial bus (USB) interface, an SD card interface, or an audio interface. The second input module 1132 may include a connector that may be physically connected to the external electronic device 2000, for example, an HDMI connector, a USB connector, an SD card connector, or an audio connector (for example, a headphone connector).

The display module 1140 visually provides information to the user. The display module 1140 may include a display panel 1141, a gate driver 1142, and a data driver 1143. The gate driver 1142 and the data driver 1143 may respectively correspond to the scan driver 320 and the data driver 340 of FIG. 1. The display module 1140 may further include a window, a chassis, and a bracket to protect the display panel 1141.

The display panel 1141 (or a display) may include a liquid crystal display panel, an organic light emitting display panel, or an inorganic light emitting display panel, and the type of display panel 1141 is not particularly limited. The display panel 1141 may be a rigid type, or a flexible type that may be rolled or folded. The display module 1140 may further include a supporter, a bracket, or a heat dissipation member for supporting the display panel 1141.

The gate driver 1142 may be mounted on the display panel 1141 as a driving chip. In addition, the gate driver 1142 may be integrated in the display panel 1141. For example, the gate driver 1142 includes an amorphous silicon TFT gate driver circuit (ASG), a low temperature polycrystaline silicon (LTPS) TFT gate driver circuit, or an oxide semiconductor TFT gate driver circuit (OSG) that is embedded in the display panel 1141. The gate driver 1142 receives a control signal from the controller 1112-1, and outputs scan signals to the display panel 1141 in response to the control signal.

The display panel 1141 may further include a light emitting driver. The light emitting driver outputs a light emitting control signal to the display panel 1141 in response to the control signal received from the controller 1112-1. The light emitting driver may be formed separately from the gate driver 1142, or may be integrated in the gate driver 1142.

The data driver 1143 receives a control signal from the controller 1112-1, converts image data into an analog voltage (for example, a data voltage) in response to the control signal, and then outputs data voltages to the display panel 1141.

The data driver 1143 may be incorporated into other constituent elements (for example, the controller 1112-1). The functions of the interface conversion circuit and the timing control circuit of the controller 1112-1 described above may be integrated into the data driver 1143.

The display module 1140 may further include a light emitting driver and a voltage generating circuit. The voltage generating circuit may output various voltages required for driving the display panel 1141.

The power module 1150 supplies power to the constituent elements of the electronic device 1000. The power module 1150 may include a battery in which a power voltage is charged. The battery may include a non-rechargeable primary battery, or a rechargeable battery or fuel cell. The power module 1150 may include a power management integrated circuit (PMIC). The PMIC supplies optimized power to each of the above-described modules and modules to be described later. The power module 1150 may include a wireless power transmission/reception member electrically connected to a battery. The wireless power transmission/reception member may include a plurality of antenna radiators in a form of a coil.

The electronic device 1000 may further include an internal module 1160 and an external module 1170. The internal module 1160 may include the sensor module 1161, the antenna module 1162, and the sound output module 1163. The external module 1170 may include the camera module 1171, a light module 1172, and the communication module 1173.

The sensor module 1161 may sense input by a user's body or input by the pen from among the first input module 1131, and may generate an electrical signal or a data value corresponding to the input. The sensor module 1161 may include at least one or more of the fingerprint sensor 1161-1, the input sensor 1161-2, and the digitizer 1161-3.

The fingerprint sensor 1161-1 may generate a data value corresponding to a user's fingerprint. The fingerprint sensor 1161-1 may include either an optical type or a capacitive type fingerprint sensor.

The input sensor 1161-2 may generate a data value corresponding to coordinate information of input by the user's body or input by the pen. The input sensor 1161-2 generates an amount of change in capacitance by the input as a data value. The input sensor 1161-2 may sense input by the passive pen, or may transmit/receive data with the active pen.

The input sensor 1161-2 may measure a bio-signal such as blood pressure, water, or body fat. For example, when the user touches a part of the body to the sensor layer or the sensing panel and does not move for a certain period of time, based on a change in an electric field by the part of the body, the input sensor 1161-2 may sense a bio-signal and output desired information to the display module 1140.

The digitizer 1161-3 may generate a data value corresponding to coordinate information of a pen input. The digitizer 1161-3 generates an electromagnetic change amount by the input as a data value. The digitizer 1161-3 may sense input by the passive pen, or may transmit/receive data with the active pen.

At least one of the fingerprint sensor 1161-1, the input sensor 1161-2, and the digitizer 1161-3 may be implemented as a sensor layer formed on the display panel 1141 through a continuous process. The fingerprint sensor 1161-1, the input sensor 1161-2, and the digitizer 1161-3 may be disposed at an upper side of the display panel 1141, and one of the fingerprint sensor 1161-1, the input sensor 1161-2, and the digitizer 1161-3, for example, the digitizer 1161-3 may be disposed at a lower side of the display panel 1141.

At least two or more of the fingerprint sensor 1161-1, the input sensor 1161-2, and the digitizer 1161-3 may be formed to be integrated into one sensing panel through the same process. When integrated into one sensing panel, the sensing panel may be disposed between the display panel 1141 and a window disposed at an upper side of the display panel 1141. According to one or more embodiments, the sensing panel may be disposed on the window, and the position of the sensing panel is not particularly limited.

At least one of the fingerprint sensor 1161-1, the input sensor 1161-2, and the digitizer 1161-3 may be embedded in the display panel 1141. That is, at least one of the fingerprint sensor 1161-1, the input sensor 1161-2, and the digitizer 1161-3 may be concurrently (e.g., simultaneously) formed through the process of forming elements (for example, a light emitting element, a transistor, and the like) included in the display panel 1141.

In addition, the sensor module 1161 may generate an electrical signal or a data value corresponding to an internal state or an external state of the electronic device 1000. The sensor module 1161 may further include, for example, a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The antenna module 1162 may include one or more antennas for transmitting or receiving a signal or power to or from the outside. According to one or more embodiments, the communication module 1173 may transmit a signal to an external electronic device or receive a signal from an external electronic device through an antenna suitable for a communication method. An antenna pattern of the antenna module 1162 may be integrated into one component (for example, the display panel 1141) of the display module 1140 or the input sensor 1161-2.

The sound output module 1163 is a device for outputting a sound signal to the outside of the electronic device 1000, and may include, for example, a speaker used for general purposes such as multimedia playback or recording playback, and a receiver used exclusively for receiving calls. According to one or more embodiments, the receiver may be formed integrally with or separately from the speaker. A sound output pattern of the sound output module 1163 may be integrated into the display module 1140.

The camera module 1171 may capture still images and moving images. According to one or more embodiments, the camera module 1171 may include one or more lenses, image sensors, or image signal processors. The camera module 1171 may further include an infrared camera capable of measuring the presence or absence of the user, the position of the user, and the gaze of the user.

The light module 1172 may provide light. The light module 1172 may include a light emitting diode or a xenon lamp. The light module 1172 may operate in conjunction with the camera module 1171 or may operate independently.

The communication module 1173 may support establishment of a wired or wireless communication channel between the electronic device 1000 and the external electronic device 2000, and communication through the established communication channel. The communication module 1173 may include one or both of a wireless communication module, such as a cellular communication module, a short range communication module, or a global navigation satellite system (GNSS) communication module and a wired communication module such as a local area network (LAN) communication module or a power line communication module. The communication module 1173 may communicate with the external electronic device 2000 through a short range communication network such as Bluetooth, WiFi direct, or infrared data association (IrDA) or a long range communication network such as a cellular network, the Internet, or a computer network (for example, LAN or WAN). The various types of the communication modules 1173 described above may be implemented as a single chip or may be implemented as separate chips.

The input module 1130, the sensor module 1161, the camera module 1171, and the like may be used to control an operation of the display module 1140 in conjunction with the processor 1110.

The processor 1110 outputs an instruction or data to the display module 1140, the sound output module 1163, the camera module 1171, or the light module 1172 based on input data received from the input module 1130. For example, the processor 1110 may generate image data in response to input data applied through a mouse or an active pen to output it to the display module 1140, or may generate instruction data in response to the input data to output it to the camera module 1171 or light module 1172. When input data is not received from the input module 1130 for a certain period of time, the processor 1110 may reduce power consumed by the electronic device 1000 by changing an operation mode of the electronic device 1000 to a low power mode or a sleep mode.

The processor 1110 outputs an instruction or data to the display module 1140, the sound output module 1163, the camera module 1171, or the light module 1172 based on sensing data received from the sensor module 1161. For example, the processor 1110 may compare authentication data applied by the fingerprint sensor 1161-1 with authentication data stored in the memory 1120 and then execute an application according to the compared result. The processor 1110 may execute an instruction based on sensed data sensed by the input sensor 1161-2 or the digitizer 1161-3, or may output corresponding image data to the display module 1140. When the sensor module 1161 includes a temperature sensor, the processor 1110 may receive temperature data for a measured temperature from the sensor module 1161, and may further perform luminance correction on image data based on the temperature data.

The processor 1110 may receive measurement data about the presence of a user, a user's position, a user's gaze, and the like, from the camera module 1171. The processor 1110 may further perform luminance correction and the like on image data based on the measurement data. For example, the processor 1110 that determines the presence of a user through an input from the camera module 1171 may output image data whose luminance is corrected through the data conversion circuit 1112-2 or the gamma correction circuit 1112-3 to the display module 1140.

Some of the above constituent elements may be connected to each other through a communication method between peripheral devices, for example, a bus, a general purpose input/output (GPIO), a serial peripheral interface (SPI), a mobile industry processor interface (MIPI), or an ultra path interconnect (UPI) link to exchange a signal (for example, an instruction or data) with each other. The processor 1110 may communicate with the display module 1140 through a mutually agreed interface, for example, may use one of the above-described communication methods, and is not limited to the above-described communication methods.

The electronic device 1000 according to various embodiments disclosed in the present disclosure may be devices of various types. The electronic device 1000 may include, for example, at least one of a portable communication device (for example, a smartphone), a computer device, a portable multimedia device, a portable medical device, a camera, a wearable device, or a home appliance. The electronic device 1000 according to one or more embodiments of the present disclosure is not limited to the above-described devices.

While the present disclosure has been shown and described with reference to certain embodiments thereof, it will be understood by those skilled in the art that various changes in forms and details may be made therein without departing from the spirit and scope of the present disclosure as defined by the appended claims and their equivalents.

Therefore, the technical scope of the present disclosure may be determined by the technical scope of the accompanying claims and their equivalents.

What is claimed is:

1. A display device comprising:
a display panel comprising a pixel;
a compensator configured to calculate a degradation rate of the pixel based on an input gray level of a first image data, and configured to compensate the first image data based on the degradation rate to generate second image data; and
a data driver configured to generate a data signal based on the second image data and configured to supply the data signal to the pixel,
wherein the pixel comprises a first element group and a second element group connected in series to each other, the first element group comprising a plurality of first light emitting elements connected in parallel with each other, and the second element group comprising a plurality of second light emitting elements connected in parallel with each other,
wherein a number of the plurality of first light emitting elements of the first element group and a number of the plurality of second light emitting elements of the second element group are different,
wherein the compensator is to calculate the degradation rate by applying first information on the number of the first light emitting elements and second information on the number of the second light emitting elements, and
wherein under a condition that a driving current flowing through the pixel is the same, the pixel is differently degraded depending on the number of the first light emitting elements and the number of the second light emitting elements.

2. The display device of claim 1, further comprising a memory configured to store the first information and the second information.

3. The display device of claim 1, wherein the compensator is configured to:
predict a value of a driving current flowing through the pixel based on the input gray level;
calculate a first current density of the first element group based on the driving current and the first information about the number of the first light emitting elements; and
calculate a first degradation rate of the first element group based on the first current density of the first element group.

4. The display device of claim 3, wherein the first current density of the first light emitting element is proportional to the driving current, and is inversely proportional to the number of the first light emitting elements.

5. The display device of claim 3, wherein the compensator is configured to:
calculate a second current density of the second element group based on the driving current and the second information about the number of the second light emitting elements;
calculate a second degradation rate of the second element group based on the second current density of the second element group; and
calculate the degradation rate of the pixel based on the first degradation rate and the second degradation rate.

6. The display device of claim 1, wherein:
the compensator is configured to calculate an output gray level of the second image data based on the input gray level and the degradation rate; and
a value to which the degradation rate is applied to the output gray level is the same as the input gray level.

7. The display device of claim 6, wherein:
the compensator is configured to calculate the output gray level based on light emitting efficiency of the pixel corresponding to the input gray level;
a current density of the pixel varies according to the input gray level; and
the light emitting efficiency varies according to the current density.

8. The display device of claim 7, wherein:
light emitting efficiency of a reference pixel corresponding to the input gray level is preset in a lookup table; and
the compensator is configured to calculate the output gray level based on the lookup table.

9. The display device of claim 7, wherein the light emitting efficiency of the pixel is calculated based on first light emitting efficiency of the first element group according to the number of the first light emitting elements and second light emitting efficiency of the second element group according to the number of the second light emitting elements.

10. An image data compensating method of a display device, the method comprising:
calculating a degradation rate of a pixel of a display panel based on an input gray level; and
compensating the input gray level based on the degradation rate to generate an output gray level,
wherein the pixel comprises a first element group and a second element group connected in series to each other, the first element group comprising a plurality of first light emitting elements connected in parallel with each other, and the second element group comprising a plurality of second light emitting elements connected in parallel with each,
wherein a number of the plurality of first light emitting elements of the first element group and a number of the plurality of second light emitting elements of the second element group are different,
wherein the calculating of the degradation rate comprises calculating the degradation rate by applying first information about the number of the first light emitting elements and second information about the number of the second light emitting elements, and
wherein under a condition that a driving current flowing through the pixel is the same, the pixel is differently degraded depending on the number of the first light emitting elements and the number of the second light emitting elements.

11. The image data compensating method of the display device of claim 10, wherein the calculating of the degradation rate further comprises obtaining the first information and the second information from a memory.

12. The image data compensating method of the display device of claim 10, wherein the calculating of the degradation rate further comprises:
predicting a value of a driving current flowing through the pixel based on the input gray level;
calculating a first current density of the first element group based on the driving current and the first information about the number of the first light emitting elements; and
calculating a first degradation rate of the first element group based on the first current density of the first element group.

13. The image data compensating method of the display device of claim 12, wherein the first current density of the first light emitting element is proportional to the driving current, and is inversely proportional to the number of the first light emitting elements.

14. The image data compensating method of the display device of claim 12, wherein the calculating of the degradation rate further comprises:
calculating a second current density of the second element group based on the driving current and the second information about the number of the second light emitting elements;
calculating a second degradation rate of the second element group based on the second current density of the second element group; and
calculating the degradation rate of the pixel based on the first degradation rate and the second degradation rate.

15. The image data compensating method of the display device of claim 10, wherein:
the output gray level is calculated based on the input gray level and the degradation rate; and
a value to which the degradation rate is applied to the output gray level is the same as the input gray level.

16. The image data compensating method of the display device of claim 15, wherein:
the generating of the output gray level comprises calculating the output gray level based on light emitting efficiency of the pixel corresponding to the input gray level;
a current density of the pixel varies according to the input gray level; and
the light emitting efficiency varies according to the current density.

17. The image data compensating method of the display device of claim 16, wherein:
light emitting efficiency of a reference pixel corresponding to the input gray level is preset in a lookup table; and the output gray level is calculated based on the lookup table.

18. The image data compensating method of the display device of claim 16, wherein the light emitting efficiency of the pixel is calculated based on first light emitting efficiency of the first element group according to the number of the first light emitting elements and second light emitting efficiency of the second element group according to the number of the second light emitting elements.

19. An electronic device comprising:
a main processor;
an auxiliary processor configured to generate second image data by compensating for first image data from the main processor; and
a display module configured to display an image based on the second image data,
wherein the display module comprises a display panel comprising a pixel, and a data driver configured to generate a data signal based on the second image data and configured to supply the data signal to the pixel,
wherein the pixel comprises a first element group and a second element group connected in series to each other, the first element group comprising a plurality of first light emitting elements connected in parallel with each other, and the second element group comprising a plurality of second light emitting elements connected in parallel with each other,
wherein a number of the plurality of first light emitting elements of the first element group and a number of the plurality of second light emitting elements of the second element group are different,
wherein the auxiliary processor configured to calculate a degradation rate for the pixel based on an input gray level of a first image data from the main processor, and configured to compensate the first image data based on the degradation rate to generate the second image data,
wherein the auxiliary processor is to calculate the degradation rate by applying first information on the number of the first light emitting elements and second information on the number of the second light emitting elements, and
wherein under a condition that a driving current flowing through the pixel is the same, the pixel is differently degraded depending on the number of the first light emitting elements and the number of the second light emitting elements.

20. An electronic device comprising:
a processor; and
a display module configured to display an image based on image data provided from the processor,
wherein the display module comprises a display panel comprising a pixel,
wherein the pixel comprises a first element group and a second element group connected in series to each other, the first element group comprising a plurality of first light emitting elements connected in parallel with each other, and the second element group comprising a plurality of second light emitting elements connected in parallel with each other,
wherein a number of the plurality of first light emitting elements of the first element group and a number of the plurality of second light emitting elements of the second element group are different,
wherein the processor is configured to calculate a degradation rate for the pixel based on an input gray level for the pixel, and configured to generate the image data by compensating the input gray level based on the degradation rate,
wherein the processor is to calculate the degradation rate by applying first information on the number of the first light emitting elements and second information on the number of the second light emitting elements, and
wherein under a condition that a driving current flowing through the pixel is the same, the pixel is differently degraded depending on the number of the first light emitting elements and the number of the second light emitting elements.

\* \* \* \* \*